(12) United States Patent
Kim et al.

(10) Patent No.: US 12,127,452 B2
(45) Date of Patent: Oct. 22, 2024

(54) DISPLAY DEVICE

(71) Applicant: Samsung Display Co., Ltd., Yongin-si (KR)

(72) Inventors: Hoon Kim, Suwon-si (KR); Chang Hyeok Choi, Asan-si (KR); Yong Sik Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 484 days.

(21) Appl. No.: 17/447,910

(22) Filed: Sep. 16, 2021

(65) Prior Publication Data

US 2022/0157914 A1 May 19, 2022

(30) Foreign Application Priority Data

Nov. 16, 2020 (KR) .......................... 10-2020-0152688

(51) Int. Cl.
| | | |
|---|---|---|
| H10K 59/131 | (2023.01) | |
| G09G 3/00 | (2006.01) | |
| H10K 59/122 | (2023.01) | |
| H10K 59/123 | (2023.01) | |

(52) U.S. Cl.
CPC .......... *H10K 59/131* (2023.02); *G09G 3/006* (2013.01); *H10K 59/122* (2023.02); *H10K 59/123* (2023.02)

(58) Field of Classification Search
CPC .. H10K 59/131; H10K 59/122; H10K 59/123; H10K 71/861; G09G 3/006; G09G 2320/0295; G09G 3/3233; G09G 2300/0426; G09G 2300/0819; G09G 2330/08; G09G 2300/0452; H01L 25/0753; H01L 25/167; H01L 27/1214; H01L 27/3244; H01L 27/3279
See application file for complete search history.

(56) References Cited

U.S. PATENT DOCUMENTS

2021/0408509 A1* 12/2021 Zhang ................... H01L 27/124

FOREIGN PATENT DOCUMENTS

| KR | 1998-0060009 A | 10/1998 |
|---|---|---|
| KR | 10-2020-0079379 A | 7/2020 |

* cited by examiner

*Primary Examiner* — Mohammad A Rahman
(74) *Attorney, Agent, or Firm* — Lewis Roca Rothgerber Christie LLP

(57) ABSTRACT

A display device is provided. The display device includes a substrate, a first electrode, a second electrode, and third electrode spaced apart from each other in a first direction on the substrate, a repair line spaced apart from the first to third electrodes in the first direction on the substrate, a repair connection portion connecting the third electrode and the repair line, and light emitting elements on respective ones of the first to third electrodes and spaced apart from each other.

20 Claims, 22 Drawing Sheets

DISPLAY DEVICE

CROSS-REFERENCE TO RELATED APPLICATION

This application claims priority to, and the benefit of, Korean Patent Application No. 10-2020-0152688, filed on Nov. 16, 2020, in the Korean Intellectual Property Office, the disclosure of which is incorporated herein by reference in its entirety.

BACKGROUND

1. Field

The present disclosure relates to a display device.

2. Description of the Related Art

The importance of a display device has increased with the development of multimedia. Accordingly, various types of display devices, such as an organic light emitting display (OLED) and a liquid crystal display (LCD), have been used.

A display device is a device for displaying an image, and includes a display panel, such as a light emitting display panel or a liquid crystal display panel. Among them, the light emitting display panel may include a light emitting element, such as a light emitting diode (LED). In this case, examples of the light emitting diode (LED) may include an organic light emitting diode (OLED) using an organic material as a fluorescent material, and an inorganic light emitting diode using an inorganic material as a fluorescent material.

SUMMARY

Aspects of the present disclosure provide a display device in which reliability of an alignment process is improved.

According to an aspect, there is provided a display device including a substrate, a first electrode, a second electrode, and third electrode spaced apart from each other in a first direction on the substrate, a repair line spaced apart from the first to third electrodes in the first direction on the substrate, a repair connection portion connecting the third electrode and the repair line, and light emitting elements on respective ones of the first to third electrodes and spaced apart from each other.

The display device may further include a circuit element layer on the substrate, and including a first voltage line for applying a first power voltage and a transistor, wherein the first to third electrodes are located on the circuit element layer.

The first electrode may be connected to the first voltage line, and the second electrode is connected to the transistor.

The third electrode may be insulated from the circuit element layer.

The circuit element layer may further include a via layer on the first voltage line and the transistor, wherein the first electrode is connected to the first voltage line through a first electrode contact hole penetrating the via layer.

The second electrode may be connected to the transistor through a second electrode contact hole penetrating the via layer.

The substrate may include a light emission area, and a sub-area spaced apart from the light emission area in a second direction crossing the first direction, wherein the first to third electrodes and the repair line extend in the second direction.

The first to third electrodes may be located across the light emission area and the sub-area.

The first to third electrodes may terminate in the sub-area.

The display device may further include a first bank surrounding the light emission area and the sub-area.

The first bank may expose at least parts of the first to third electrodes and may completely cover the repair line from above.

The light emitting element may include a first light emitting element having ends respectively located on the first electrode and the second electrode, and a second light emitting element having ends respectively located on the second electrode and the third electrode.

The light emitting element might not be between the third electrode and the repair line.

The display device may further include a first insulating layer on the first to third electrodes, and defining a first opening exposing a part of an upper surface of the first electrode in the sub-area, and a second opening exposing a part of an upper surface of the second electrode in the sub-area.

The display device may further include a contact electrode on the first insulating layer, and including a first contact electrode contacting the first electrode through the first opening, and a second contact electrode contacting the second electrode through the second opening.

The first insulating layer may cover the third electrode.

According to another aspect, there is provided a display device including a substrate, and pixels on the substrate, each including a first electrode, a second electrode, and third electrode spaced apart from each other in a first direction on the substrate, a repair line spaced apart from the first to third electrodes in the first direction on the substrate, a repair connection portion between the third electrode and the repair line, and light emitting elements on respective ones of the first to third electrodes and spaced apart from each other, wherein the repair connection portion of a first pixel of the pixels connects the repair line of the first pixel and the third electrode of the first pixel, and wherein the repair connection portion of a second pixel of the pixels is cut between the repair line of the second pixel and the third electrode of the second pixel.

The display device may further include a circuit element layer on the substrate, and including a first voltage line for applying a first power voltage and a transistor, wherein the first to third electrodes are on the circuit element layer.

The first electrode may be connected to the first voltage line, wherein the second electrode is connected to the transistor.

The third electrode may be insulated from the circuit element layer.

However, aspects of the present disclosure are not restricted to the those set forth herein. The above and other aspects of the present disclosure will become more apparent to one of ordinary skill in the art to which the present disclosure pertains by referencing the detailed description of the present disclosure given below.

Because a display device according to some embodiments may include first to third electrodes, a repair line, and a repair connection portion for connecting the third electrode and the repair line, even if a defect occurs in the third electrode not connected to a circuit element layer, the third electrode may be repaired, and thus reliability of an alignment process of light emitting elements may be improved.

The aspects of the present disclosure are not limited by the foregoing, and other various aspects are anticipated herein.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
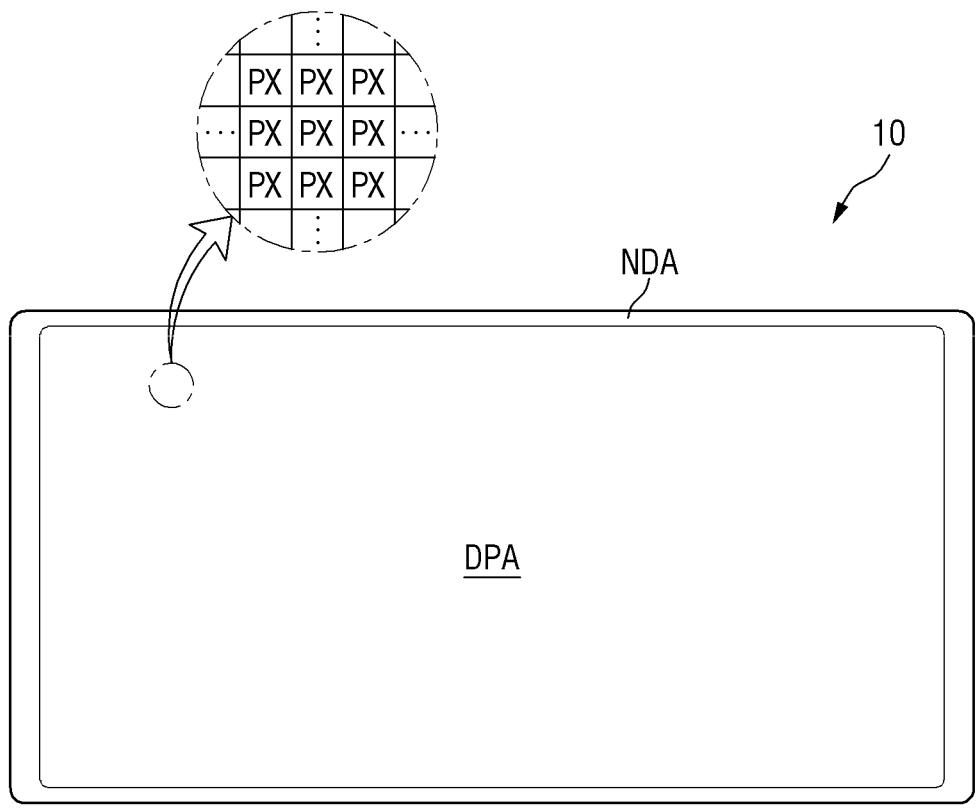
FIG. 1 is a schematic plan view of a display device according to some embodiments.
Figure 1:
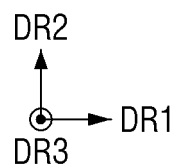

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device according to some embodiments.

Referring to FIG. 1, a display device 10 displays a moving image or a still image. The display device 10 may refer to any electronic device that provides a display screen. Examples of the display device 10 may include televisions, notebook computers, monitors, billboards, things of internet (IoTs), mobile phones, smart phones, tablet personal computers (tablet PCs), electronic watches, smart watches, watch phones, head mount displays, mobile communication terminals, electronic notebooks, electronic books, portable multimedia players (PMPs), navigators, game machines, digital cameras, and camcorders.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel is used as the display panel will be described as an example, but the present disclosure is not limited thereto. Other display panels may be applied as long as the same technical spirit is applicable.

In the drawings for explaining the display device 10 of embodiments, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 is perpendicular to each of the first direction DR1 and the second direction DR2. In embodiments explaining the display device 10, the third direction DR3 represents a thickness direction (or display direction) of the display device 10.

The display device 10 may have a rectangular shape in which sides in the first direction DR1 are longer than sides in the second direction DR2 in a plan view. In a plan view, the corner of the display device 10 where a long side meets a short side may be right-angled, but is not limited thereto, and may have a rounded curved shape. The shape of the display device 10 is not limited to those exemplified, and may be variously changed. For example, the display device 10 may have a shape such as a square, a rectangle having rounded corners (vertexes), a polygon, or a circle in a plan view.

The display surface of the display device 10 may be located at one side of the third direction DR3, which is a thickness direction. In the embodiments for explaining the display device 10, unless otherwise stated, the term "upper" refers to a display direction toward one side in the third direction DR3, likewise the "upper surface" refers to a surface facing one side in the third direction DR3. The term "lower" refers to a direction opposite to the display direction toward the other side in the third direction DR3, and the "lower surface" refers to a surface facing the other side in the third direction DR3. Further, the "left," "right," "upper," and "lower" refer to directions when the display device 10 is viewed on the plane. For example, the "right side" refers to one side in the first direction DR1, the "left side" refers to the other side in the first direction DR1, the "upper side" refers to one side in the second direction DR2, and the "lower side" refers to the other side in the second direction DR2.

The display device 10 may include a display area DPA and a non-display area NDA. The display area DPA is an area where an image is displayed, and the non-display area NDA is an area where an image is not displayed.

The shape of the display area DPA may follow the shape of the display device 10. For example, the display area DPA may have a planar rectangular shape that is similar to the overall shape of the display device 10. The display area DPA may generally occupy the center of the display device 10.

The display area DPA may include a plurality of pixels PX. The plurality of pixels PX may be arranged in a matrix direction. The shape of each of the pixels PX may be rectangular or square in a plan view. In some embodiments, each pixel PX may include a plurality of light emitting elements made of inorganic particles.

The non-display area NDA may be located around the display area DPA. The non-display area NDA may entirely or partially surround the display area DPA. The non-display area NDA may constitute a bezel of the display device 10.

Figure 2:
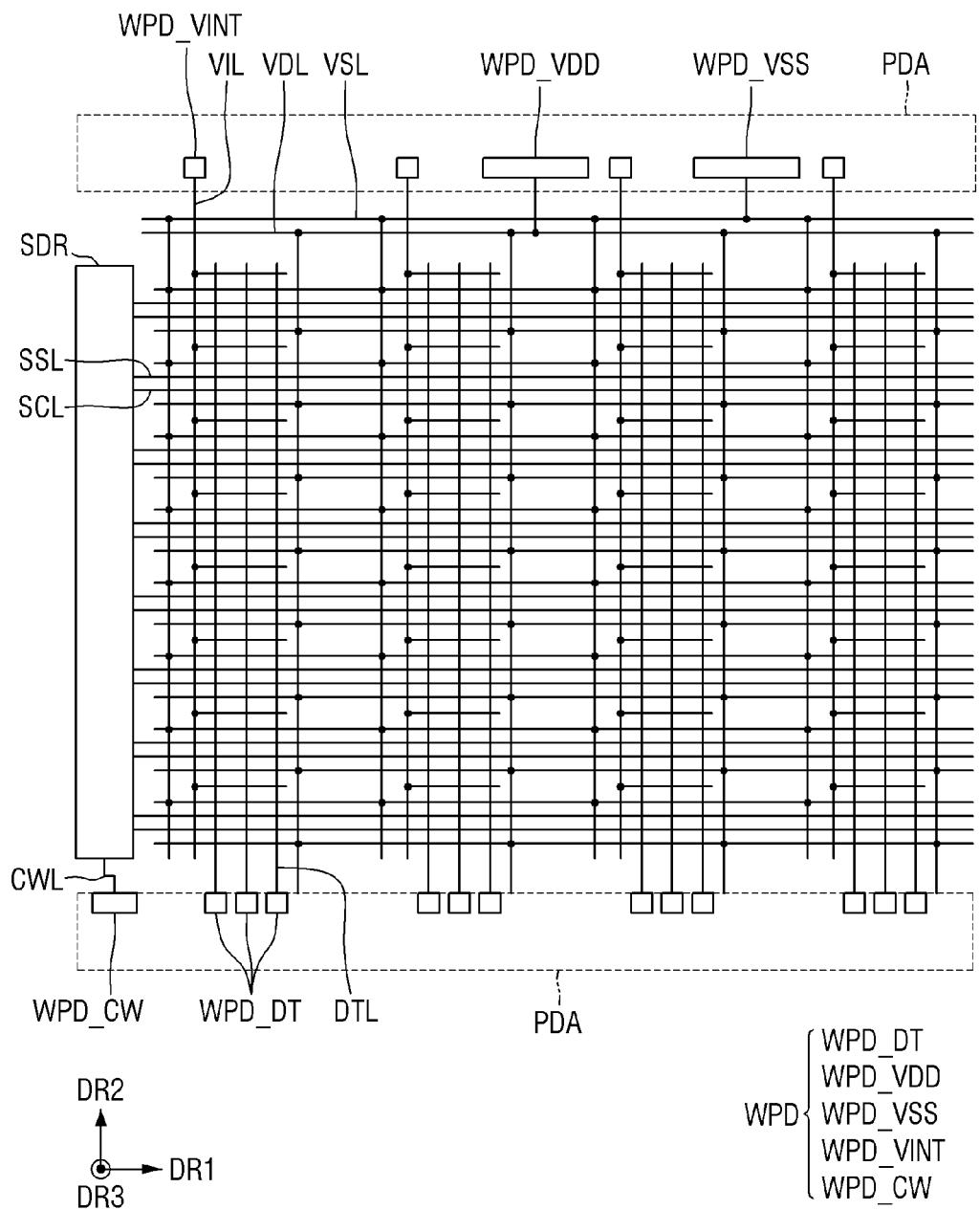
FIG. 2 is a schematic layout view of lines included in a display device according to some embodiments.

FIG. 2 is a schematic layout view of lines included in a display device according to some embodiments.

Referring to FIG. 2, the display device 10 may include a plurality of lines. The plurality of lines may be included in a circuit element layer CCL (refer to FIG. 6) to be described below. The plurality of lines may include a scan line SCL, a sensing line SSL, a data line DTL, an initialization voltage line VIL, a first voltage line VDL, and a second voltage line VSL. In some embodiments, the display device 10 may be provided with other lines.

Meanwhile, as used herein, the term "connection" may mean that not only any one member is connected to another member through physical contact with each other, but also connected to another member through still another member. Further, it may be understood that one portion and the other portion of one integrated member are connected to each other. Moreover, it may be interpreted that the connection between any one member and another member includes direct contact connection and electrical connection through still another member.

The scan line SCL and the sensing line SSL may extend in the first direction DR1. The scan line SCL and the sensing line SSL may be connected to a scan driver SDR. The scan driver SDR may include a driving circuit. The scan driver SDR may be located in the non-display area NDA. In some embodiments, the scan driver SDR may be located in the non-display area NDA adjacent to a first short side (e.g., the left side in FIG. 1) of the display device 10, but the present disclosure is not limited thereto. In other embodiments, the scan driver SDR also may be located, or instead may be located, in the non-display area NDA adjacent to a second short side (e.g., the right side in FIG. 1) of the display device 10. The scan driver SDR is connected to a signal connection line CWL, and at least one end of the signal connection line CWL may be connected to an external device by forming a wiring pad WPD_CW (hereinafter, referred to as a "signal connection pad") on the non-display area NDA.

The data line DTL and the initialization voltage line VIL may extend in the second direction DR2 crossing the first direction DR1. The initialization voltage line VIL may further include a portion branched in the first direction DR1 in addition to the portion extending in the second direction DR2.

The first voltage line VDL and the second voltage line VSL may extend in the second direction DR2. Each of the first voltage line VDL and the second voltage line VSL may further include a portion extending in the first direction DR1. The portion of each of the first voltage line VDL and the second voltage line VSL in the first direction DR1, and the portion of each of the first voltage line VDL and the second voltage line VSL in the second direction DR2, may be made of conductive layers located on different layers from each other. Each of the first voltage line VDL and the second voltage line VSL may have a mesh structure, but the structure thereof is not limited thereto.

The data line DTL, the initialization voltage line VIL, the first voltage line VDL, and the second voltage line VSL may be electrically connected to at least one wiring pad WPD. Each wiring pad WPD may be located in a pad area PDA included in the non-display area NDA. The pad areas PDA may be located in the non-display area NDA adjacent to a first long side (e.g., the upper side in FIG. 1) of the display device 10, and in the non-display area NDA located adjacent to a second long side (e.g., the lower side in FIG. 1) of the display device 10.

In some embodiments, the wiring pad (WPD_DT, hereinafter referred to as a "data pad") of the data line DTL may be located in the underlying pad area PDA, and the wiring pad (WPD_VINT, hereinafter referred to as an "initialization voltage pad") of the initialization voltage line VIL, the wiring pad (WPD_VDD, hereinafter referred to as a "first voltage pad") of the first voltage line VDL, and the wiring pad (WPD_VSS, hereinafter referred to as a "second voltage pad") of the second voltage line VSL may be located in the overlying pad area PDA. As another example, the data pad WPD_DT, the initialization voltage pad WPD_VINT, the first voltage pad WPD_VDD, and the second voltage pad WPD_VSS may all be located in the same area, that is, the overlying pad area PDA. An external device may be mounted on the wiring pad WPD. The external device may be mounted on the wiring pad WPD through an anisotropic conductive film, ultrasonic bonding, or the like.

Each pixel PX of the display device 10 includes a pixel driving circuit. The above-described lines may apply a driving signal to each pixel driving circuit while passing through each pixel PX or a periphery thereof. The pixel driving circuit may include a transistor and a capacitor. The number of transistors and capacitors in each pixel driving circuit may be variously changed. Each sub-pixel SPX of the display device 10 according to some embodiments may have a 3T1C structure in which a pixel driving circuit includes three transistors and one capacitor. Hereinafter, a case where the pixel driving circuit included in the display device 10 has a 3T1C structure will be described as an example, but the present disclosure is not limited thereto, and various other modified pixel structures such as a 2T1C structure, a 7T1C structure, and a 6T1C structure may also be applied.

Figure 3:
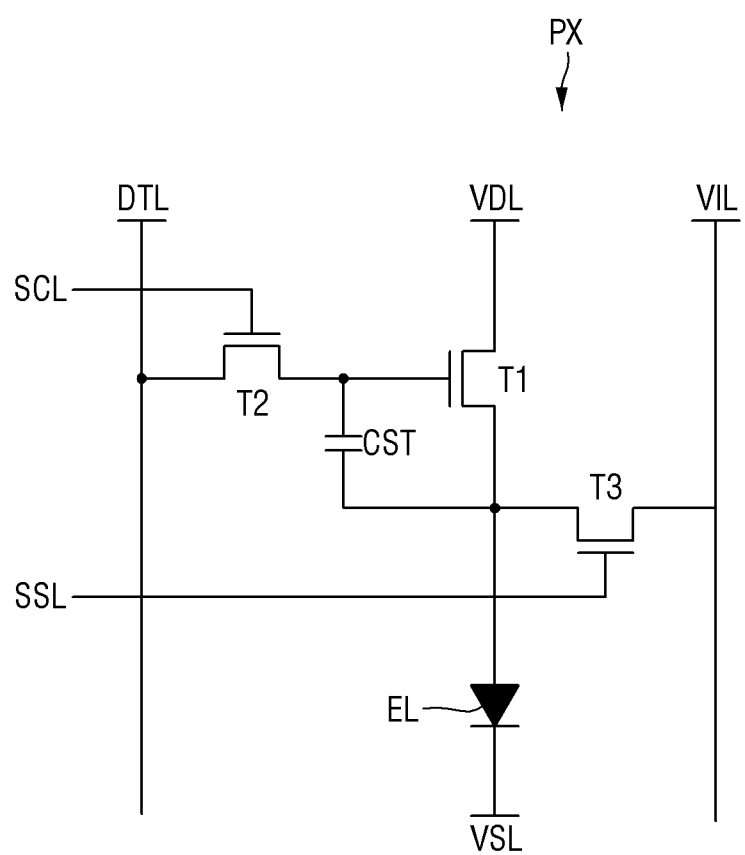
FIG. 3 is an equivalent circuit diagram of one pixel of a display device according to some embodiments.

FIG. 3 is an equivalent circuit diagram of one sub-pixel of a display device according to some embodiments.

Referring to FIG. 3, each pixel PX of the display device 10 according to some embodiments may include a light emitting diode EL, a plurality of transistors T1, T2, and T3, and a capacitor CST. The plurality of transistors T1, T2, and T3 may include a first transistor T1, a second transistor T2, and a third transistor T3.

The light emitting diode EL emits light according to a current supplied through the first transistor T1. The light emitting diode EL may include a first electrode, a second electrode, and at least one light emitting element located between the first electrode and the second electrode. The light emitting element may emit light of a corresponding (e.g., specific) wavelength band by electric signals transmitted from the first electrode and the second electrode.

One end of the light emitting diode EL may be connected to a source electrode of the first transistor T1, and the other end thereof may be connected to the second voltage line VSL to which a low-potential voltage (hereinafter, a second power voltage) that is lower than a high-potential voltage (hereinafter, a first power voltage) of the first voltage line VDL is supplied.

The first transistor T1 adjusts a current flowing from the first voltage line VDL, to which the first power voltage is supplied, to the light emitting diode EL according to a difference in voltage between a gate electrode and a source electrode. For example, the first transistor T1 may be a driving transistor for driving the light emitting diode EL. The gate electrode of the first transistor T1 may be connected to the second source/drain electrode of the second transistor T2, the source electrode of the first transistor T1 may be connected to the first electrode of the light emitting diode EL, and the drain electrode of the first transistor T1 may be connected to the first voltage line VDL to which the first power voltage is applied.

The second transistor T2 is turned on by a scan signal of the scan line SCL to connect the data line DTL to the gate electrode of the first transistor T1. The gate electrode of the second transistor T2 may be connected to the scan line SCL, the second source/drain electrode of the second transistor T2 may be connected to the gate electrode of the first transistor T1, and the first source/drain electrode of the second transistor T2 may be connected to the data line DTL.

The third transistor T3 is turned on by a sensing signal of the sensing line SSL to connect the initialization voltage line VIL to the source electrode of the first transistor T1. The gate electrode of the third transistor T3 may be connected to the sensing line SSL, and the first source/drain electrode of the third transistor T3 may be connected to the initialization voltage line VIL, and the second source/drain electrode of the third transistor T3 may be connected to the source electrode of the first transistor T1.

In some embodiments, the first source/drain electrode of each of the second and third transistors T2 and T3 may be a source electrode, and the second source/drain electrode thereof may be a drain electrode, or vice versa in other embodiments, but the present disclosure is not limited thereto.

The capacitor CST is formed between the gate electrode of the first transistor T1 and the source electrode of the first transistor T1. The capacitor CST stores a voltage difference between the gate voltage and source voltage of the first transistor T1.

Each of the first to third transistors T1, T2, and T3 may be formed as a thin film transistor. Although it is shown in FIG. 3 that the first to third transistors T1, T2, and T3 are formed as N-type MOSFETs (Metal Oxide Semiconductor Field Effect Transistors), the present disclosure is not limited thereto. That is, the first to third transistors T1, T2, and T3 may be formed as P-type MOSFETs, or some of the first to third transistors T1, T2, and T3 may be formed as N-type MOSFETs and others thereof may be formed as P-type MOSFETs.

Figure 4:
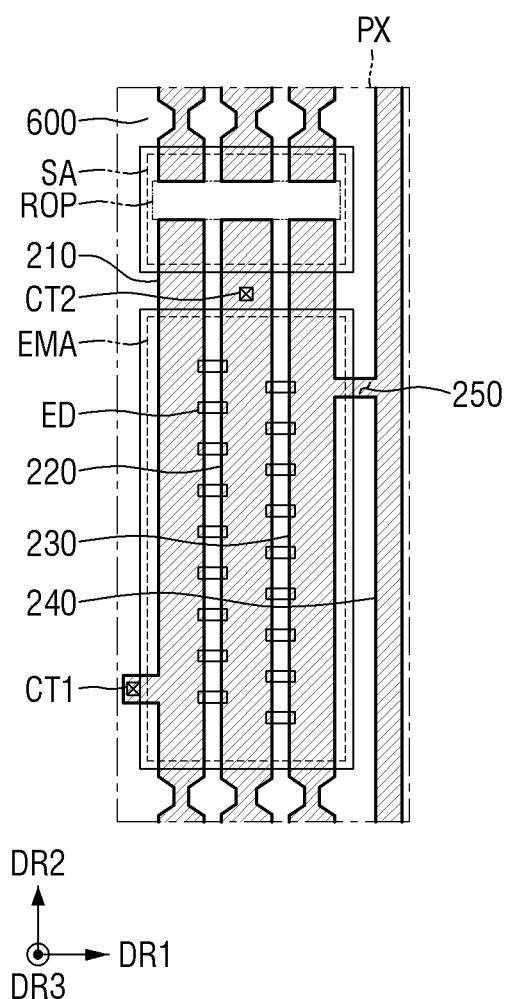
FIG. 4 is a schematic plan view illustrating one pixel of a display device according to some embodiments.

FIG. 4 is a schematic plan view of one pixel of a display device according to some embodiments.

Referring to FIG. 4, one pixel PX of the display device 10 according to some embodiments may include a first bank 600, a plurality of electrodes 210, 220, and 230, a repair line 240, and a repair connection portion 250.

Hereinafter, a planar arrangement of the first bank 600, the plurality of electrodes 210, 220, and 230, the repair line 240, and the repair connection portion 250, included in one pixel PX, will be briefly described with reference to FIG. 4.

Each pixel PX of the display device 10 may include a light emission area EMA and a non-light emission area. The light emission area EMA may be defined as an area through which light emitted from the light emitting element ED is output, and the non-light emission area may be defined as an area in which light emitted from the light emitting element ED does not reach, and thus light is not output.

The light emission area EMA may include an area in which the light emitting element ED is located, and an area adjacent thereto. The light emission area EMA may further include an area in which light emitted from the light emitting element ED is reflected or refracted by another member, and then is output.

Each pixel PX may further include a sub-area SA located in the non-light emission area. The light emitting element ED might not be located in the sub-area SA. The sub-area SA may be located at the upper side (or at one side in the second direction DR2) of the light emission area EMA in one pixel PX. The sub-area SA may be located between neighboring light emission areas EMA of the pixel PX adjacent each other in the second direction DR2.

The sub-area SA may include a separator (e.g., separating area) ROP. The separator ROP of the sub-area SA is a region in which the first to third electrodes 210, 220, and 230 adjacent to each other along the second direction DR2, which are included in each pixel PX, are separated from each other.

The plurality of electrodes 210, 220, 230 may include a first electrode 210, a second electrode 220, and a third electrode 230. The first to third electrodes 210, 220, and 230 may be formed as a plurality of alignment lines 210', 220', and 230' (refer to FIG. 10) extending in the second direction DR2 in the process of manufacturing the display device 10, and may be used in generating an electric field in the pixel PX to align the light emitting elements ED. The light emitting elements ED may be aligned by receiving a dielectrophoretic force by an electric field generated on the plurality of alignment lines 210', 220', and 230'. After the alignment process of the light emitting elements ED is performed, the plurality of alignment lines 210', 220', and 230' may be separated from the separator ROP of the sub-area SA, and may be formed into the first to third electrodes 210, 220, and 230.

The first bank 600 may include portions extending in the first direction DR1 and the second direction DR2, and may be located in a grid pattern on the entire surface of the display area DPA in a plan view. The first bank 600 may be located across the boundary of each pixel PX to distinguish neighboring pixels PX. The first bank 600 is located so as to surround the light emission area EMA and the sub-area SA in each pixel PX to distinguish them. That is, the light emission area EMA and sub-area SA of each pixel PX may be defined by the first bank 600.

The first electrode 210 may be located at the left side of each pixel PX in a plan view. The first electrode 210 may have a shape extending in the second direction DR2 in a plan view. The first electrode 210 may be located to traverse the light emission area EMA. The first electrode 210 may extend in the second direction DR2 in a plan view, and may be separated from the first electrode 210 of the pixel PX that is adjacent in the second direction DR2 at the separator ROP of the sub-area SA.

The third electrode 230 may be located to be spaced apart from the first electrode 210 in the first direction DR1. The third electrode 230 may be located at the right side of each pixel PX in a plan view. The third electrode 230 may have a shape extending in the second direction DR2 in a plan view. The third electrode 230 may be located to traverse the light emission area EMA. The third electrode 230 may extend in the second direction DR2 in a plan view, and may be separated from the third electrode 230 of the pixel PX that is adjacent in the second direction DR2 at the separator ROP of the sub-area SA.

The second electrode 220 may be located between the first electrode 210 and the third electrode 230. The second electrode 220 may be located between the first electrode 210 and the third electrode 230 to be spaced apart from them in the first direction DR1. The second electrode 220 may be located at the center of each pixel PX in a plan view. The second electrode 220 may have a shape extending in the second direction DR2 in a plan view. The second electrode 220 may be located to traverse the light emission area EMA. The second electrode 220 may extend in the second direction DR2 in a plan view, and may be separated from the second electrode 220 of the pixel PX that is adjacent in the second direction DR2 at the separator ROP of the sub-area SA.

The repair line 240 may be located to be spaced apart from the third electrode 230 in the first direction DR1. The repair line 240 may be located at the right side of the third electrode 230 in a plan view. The repair line 240 may be located in a non-light emission area. The repair line 240 may be electrically connected to the third electrode 230 of each pixel PX. When a defect occurs in a third alignment line 230' (refer to FIG. 10) in the alignment process of a light emitting element ED to be described below, the repair line 240 may serve to transmit an alignment signal applied to third alignment line 230' to a plurality of normal pixels arranged in the same row as defective pixels even if the repair process of cutting the defective third alignment line 230' is performed.

The repair line 240 may have a shape extending in the second direction DR2 in a plan view. The repair line 240 may extend in the second direction DR2 in a plan view, and may be located across a plurality of pixels PX arranged in the same column. That is, the repair line 240 is not separated, and may connect a plurality of pixels PX arranged in the same column as one line.

The repair line 240 may overlap the first bank 600 in the third direction DR3. The first bank 600 may be located on the repair line 240 to completely cover the repair line 240. As the first bank 600 is located to completely cover the repair line 240, it is possible to reduce or prevent alignment of the light emitting elements ED between the third electrode 230 and the repair line 240 during a process of aligning and arranging the plurality of light emitting elements ED.

The repair line 240 may be connected to the third electrode 230 of each pixel PX through the repair connection portion 250. The repair connection portion 250 may be located between the third electrode 230 and the repair line 240 to connect them. There may be a repair connection portion 250 positioned for each pixel PX. Meanwhile, although it is shown that the repair connection portion 250 connects the repair line 240 with a part of the third electrode 230 located in the light emission area EMA, the present disclosure is not limited thereto. For example, the repair connection portion 250 may connect the repair line 240 with a part of the third electrode 230 located in the sub-area SA.

The repair connection portion 250 may connect the third alignment lines 230' of a plurality of normal pixels arranged in the same column as the defective pixels to the repair line 240 even if the plurality of normal pixels arranged in the same column as the defective pixels are separated from each other by cutting the defective third alignment lines 230' of each pixel PX through a repair process in the process of aligning the light emitting elements ED. Accordingly, alignment signals may be applied to the third alignment lines 230', which are separated from each other, of the plurality of normal pixels.

Meanwhile, although it is shown in FIG. 4 that the repair connection portion 250 connects the third electrode 230 and the repair line 240 to each other, the present disclosure is not limited thereto. For example, the repair connection portion 250 located in the defective pixel PX may be cut so as to separate the third electrode 230 of the defective pixel PX and the repair line 240 from each other. Details thereof will be described below.

The plurality of light emitting elements ED may be located between the plurality of electrodes 210, 220, and 230. The light emitting element ED may have a shape extending in one direction, and the extending direction of the light emitting element ED may be substantially perpendicular to the extending direction of each of the electrodes 210, 220, and 230. However, the present disclosure is not limited thereto, and the plurality of light emitting elements ED may be obliquely located with respect to the extending direction of the plurality of electrodes 210, 220, and 230.

The light emitting element ED may be located between the first electrode 210 and the second electrode 220 such that both ends thereof are located on the first electrode 210 and the second electrode 220, respectively, or may be located between the second electrode 220 and the third electrode 230 such that both ends thereof are located on the second electrode 220 and the third electrode 230, respectively.

Figure 5:
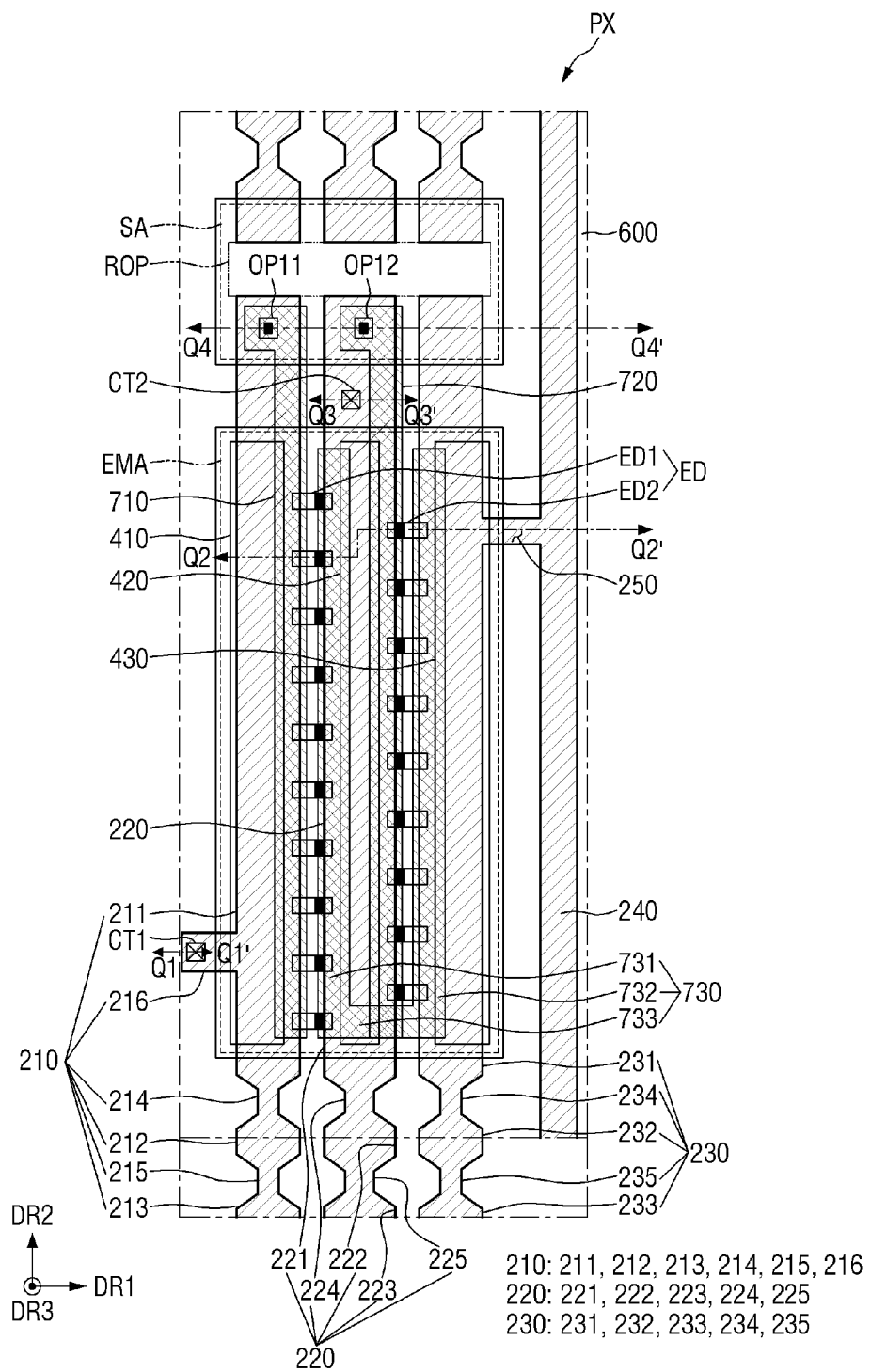
FIG. 5 is a plan view of one pixel illustrating a display device according to some embodiments.
Figure 6:
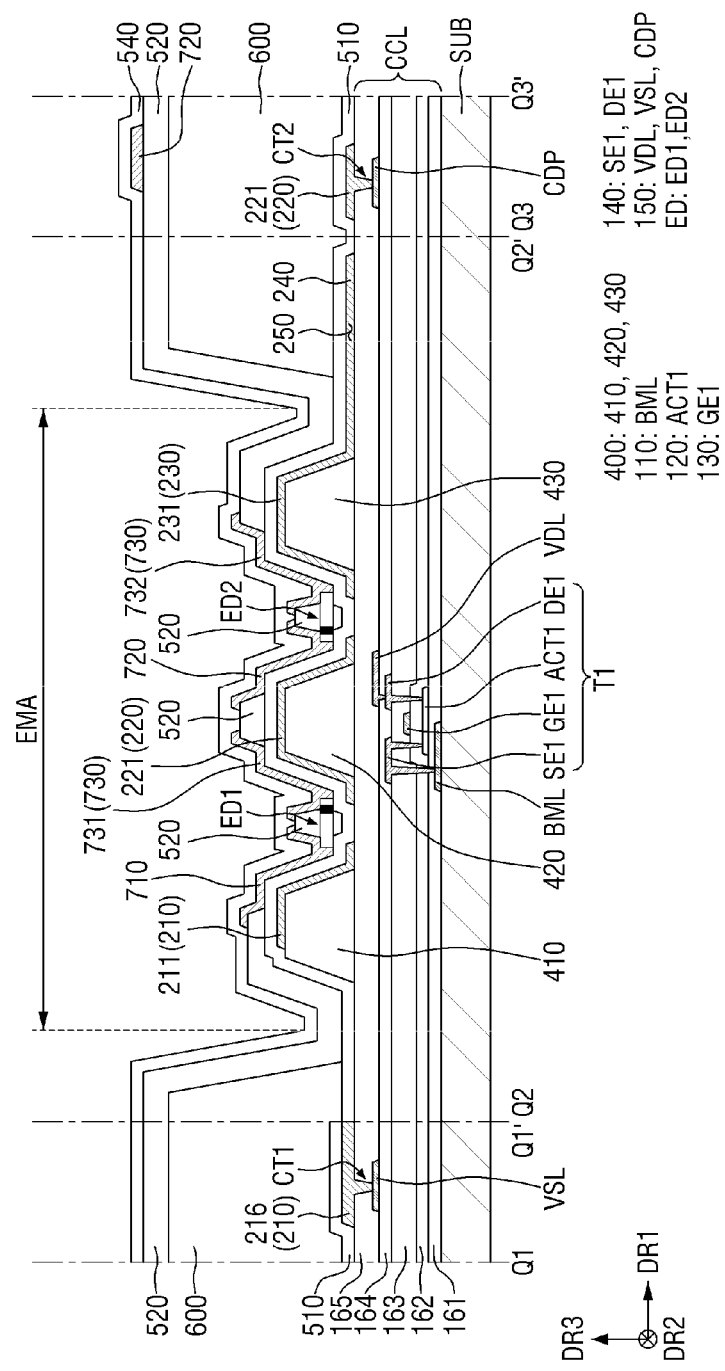
FIG. 6 is a cross-sectional view taken along the lines Q1-Q1', Q2-Q2', and Q3-Q3' of FIG. 5.
Figure 7:
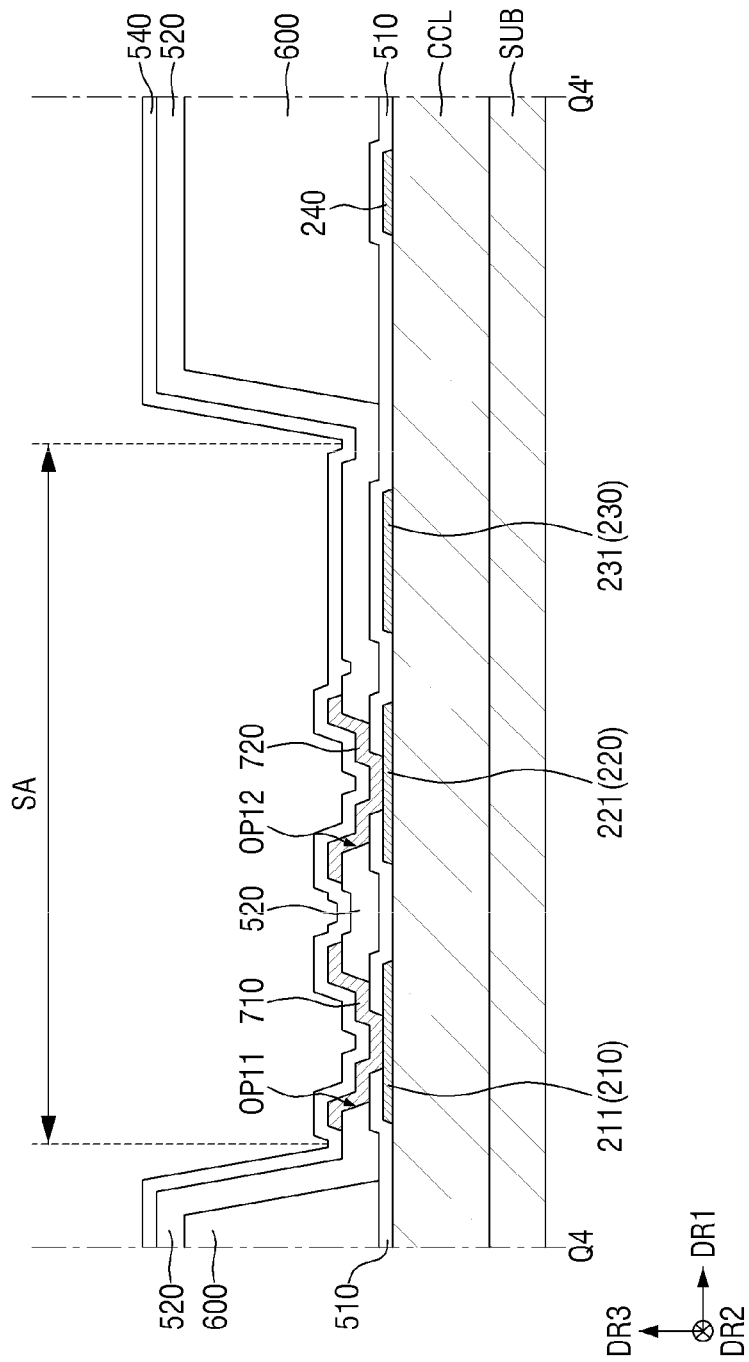
FIG. 7 is a cross-sectional view taken along the line Q4-Q4' of FIG. 5.

FIG. 5 is a plan view of one pixel illustrating a display device according to some embodiments, FIG. 6 is a cross-sectional view taken along the lines Q1-Q1', Q2-Q2', and Q3-Q3' of FIG. 5, and FIG. 7 is a cross-sectional view taken along the line Q4-Q4' of FIG. 5.

Referring to FIGS. 4 to 7, the display device 10 may include a substrate SUB, a circuit element layer CCL located on the substrate SUB, and a display element layer including a plurality of light emitting elements, a plurality of electrodes, a plurality of contact electrodes, and a plurality of insulating layers, which are arranged on the circuit element layer CCL.

First, the substrate SUB and the plurality of layers of the circuit element layer CCL located on the substrate SUB will be described with reference to FIG. 6.

The substrate SUB may be an insulating substrate. The substrate SUB may be made of an insulating material such as glass, quartz, or polymer resin. The substrate SUB may be a rigid substrate, but may also be a flexible substrate capable of bending, folding, rolling, and the like.

A lower metal layer 110 may be located on the substrate SUB. The lower metal layer 110 may include a first pattern BML. The first pattern BML may be a light blocking layer serving to protect an active layer ACT1 of the first transistor T1. The lower metal layer 110 may include a light blocking material. For example, the lower metal layer 110 may be formed of an opaque metal material that blocks light transmission.

The first pattern BML may be located below the active layer ACT1 to cover, or overlap, at least a channel region of the active layer ACT1 of the first transistor T1. Moreover, the first pattern BML may be located to cover the entire active layer ACT1 of the first transistor T1. However, the present disclosure is not limited thereto, and the lower metal layer 110 may be omitted.

The buffer layer 161 may be located on the lower metal layer 110. The buffer layer 161 may be located to cover the entire surface of the substrate SUB on which the lower metal layer 110 is located. The buffer layer 161 may serve to protect a transistor from moisture penetrating through the substrate SUB, which may be vulnerable to moisture permeation.

A semiconductor layer 120 is located on the buffer layer 161. The semiconductor layer 120 may include an active layer ACT of the first transistor T1. As described above, the active layer ACT of the first transistor T1 may be located to overlap the first pattern BML of the lower metal layer 110.

The semiconductor layer 120 may include polycrystalline silicon, monocrystalline silicon, an oxide semiconductor, or the like. In some embodiments, when the semiconductor layer 120 includes polycrystalline silicon, the polycrystalline silicon may be formed by crystallizing amorphous silicon. When the semiconductor layer 120 includes polycrystalline silicon, the active layer ACT1 of the first transistor T1 may include a plurality of doping regions doped with impurities, and a channel region therebetween. In other embodiments, the semiconductor layer 120 may include an oxide semiconductor. Examples of the oxide semiconductor may include indium-tin oxide (ITO), indium-zinc oxide (IZO), indium-gallium oxide (IGO), indium-Indium-zinc-tin Oxide (IZTO), indium-gallium-zinc oxide (IGZO), indium-gallium-tin oxide (IGTO), and/or indium-gallium-zinc-tin oxide (IGZTO).

A gate insulating layer 162 may be located on the semiconductor layer 120. The gate insulating layer 162 may function as a gate insulating layer of each transistor. The gate insulating layer 162 may be formed as multiple layers in which inorganic layers including at least one inorganic material of silicon oxide (SiOx), silicon nitride (SiNx), and/or silicon oxynitride (SiOxNy) are alternately stacked.

A first conductive layer 130 may be located on the gate insulating layer 162. The first conductive layer 130 may include a gate electrode GE1 of the first transistor T1. The gate electrode GE1 may be located to overlap the channel region of the active layer ACT in the third direction DR3, which is a thickness direction.

A first interlayer insulating layer 163 is located on the first conductive layer 130. The first interlayer insulating layer 163 may be located to cover the gate electrode GE1. The first interlayer insulating layer 163 may function as an insulating layer between the first conductive layer 130 and other layers located thereon, and may protect the first conductive layer 130.

A second conductive layer 140 is located on the first interlayer insulating layer 163. The second conductive layer 140 may include a first source electrode SE1 and first drain electrode DE1 of the first transistor T1. In some embodiments, the second conductive layer 140 may further include a data line or a first electrode of the capacitor CST.

The first source electrode SE1 and first drain electrode DE1 of the first transistor T1 may be electrically connected to respective end regions of the active layer ACT through a contact hole penetrating the first interlayer insulating layer 163 and the gate insulating layer 162. Further, the source electrode SE1 may be electrically connected to the first pattern BML of the lower metal layer 110 through a contact hole penetrating the first interlayer insulating layer 163, the gate insulating layer 162, and the buffer layer 161.

A second interlayer insulating layer 164 is located on the second conductive layer 140. The second interlayer insulating layer 164 may function as an insulating layer between the second conductive layer 140 and other layers located thereon, and may protect the second conductive layer 140.

A third conductive layer 150 is located on the second interlayer insulating layer 164. The third conductive layer 150 includes a first voltage line VDL, a second voltage line VSL, and a first conductive pattern CDP. In some embodiments, the third conductive layer 150 may further include a second electrode of the capacitor CST, and the second electrode of the capacitor CST may be electrically connected to the first conductive pattern CDP.

A high-potential voltage (or a first power voltage) supplied to the first transistor T1 may be applied to the first voltage line VDL, and a low-potential voltage (or a second power voltage), which is lower than the high-potential voltage supplied to the first voltage line VDL, may be applied to the second voltage line VSL.

The first voltage line VDL may be electrically connected to the drain electrode DE1 of the first transistor T1 penetrating the second interlayer insulating layer 164.

The second voltage line VSL may be electrically connected to the first electrode 210 through a first electrode contact hole CT1 passing through a via layer 165 to be described below. The second power voltage applied to the second voltage line VSL may be supplied to the first electrode 210. During the process of manufacturing the display device 10, an alignment signal required to align the light emitting element ED may be applied to the second voltage line VSL.

The first conductive pattern CDP may be electrically connected to the first transistor T1. The first conductive pattern CDP may be electrically connected to the second electrode 220 through a second electrode contact hole CT2. The first transistor T1 may transmit the first power voltage applied from the first voltage line VDL to the second electrode 220 through the first conductive pattern CDP.

The via layer 165 is located on the third conductive layer 150. The via layer 165 may be located on the second interlayer insulating layer 164 on which the third conductive layer 150 is located. The via layer 165 may include an organic insulating material, for example, an organic material such as polyimide (PI). The via layer 165 may perform a surface planarization function.

The buffer layer 161, the gate insulating layer 162, the first interlayer insulating layer 163, and the second interlayer insulating layer 164 may be formed of a plurality of inorganic layers alternately stacked. For example, the buffer layer 161, the gate insulating layer 162, the first interlayer insulating layer 163, and the second interlayer insulating layer 164 may be formed as a double layer structure in which inorganic layers each including at least one of silicon oxide (SiOx), silicon nitride (SiNx), and/or silicon oxynitride (SiOxNy) are stacked, or a multilayer structure in which the inorganic layers are alternately stacked. However, the present disclosure is not limited thereto, and the buffer layer 161, the gate insulating layer 162, the first interlayer insulating layer 163, and the second interlayer insulating layer 164 may be formed as one inorganic layer including the above-described insulating material.

The first conductive layer 130, the second conductive layer 140, and the third conductive layer 150 may each be formed as a single layer or multiple layers including any one of molybdenum (Mo), aluminum (Al), chromium (Cr), gold (Au), titanium (Ti), and nickel. (Ni), neodymium (Nd), and/or copper (Cu), and/or an alloy thereof.

A display element layer may be located on the via layer 165. The display element layer may include a first bank 600, a second bank 400, a plurality of electrodes 210, 220, and 230, a light emitting element ED, a plurality of contact electrodes 710, 720, and 730, a repair line 240, and a repair connection portion 250. The display element layer may further include a plurality of insulating layers 510, 520, and 540.

Hereinafter, a structure of the display element layer located on the circuit element layer CCL will be described with reference to FIGS. 4 to 7.

The second bank 400 may be located in the light emission area EMA. The second bank 400 may have a shape extending from the light emission area EMA in the second direction DR2. The second bank 400 may extend in the second direction DR2, and may be spaced apart from the first bank 600 surrounding the light emission area EMA. That is, the length of the second bank 400 in the second direction DR2 may be less than the length of the light emission area EMA surrounded by the first bank 600 in the second direction DR2.

The second bank 400 may include a plurality of sub-banks spaced apart from each other in the light emission area EMA. The second bank 400 may include a first sub-bank 410, a second sub-bank 420, and a third sub-bank 430.

The first sub-bank 410 may be located at the left side of the light emission area EMA in a plan view.

The third sub-bank 430 may be located to be spaced apart from the first sub-bank 410 in the first direction DR1. The third sub-bank 430 may be located at the right side of the light emission area EMA in a plan view.

The second sub-bank 420 may be located between the first sub-bank 410 and the third sub-bank 430. The second sub-bank 420 may be located between the first sub-bank 410 and the third sub-bank 430 to be spaced apart from them in the first direction DR1. The second sub-bank 420 may be located at the center of the light emission area EMA in a plan view.

The second bank 400 may be directly located on the via layer 165. The second bank 400 may have a structure in which at least a part thereof protrudes upward (for example, toward one side in the third direction DR3) based on the upper surface of the via layer. The protrusion portion of the second bank 400 may have an inclined side surface.

Because the second bank 400 includes the inclined side surface, the second bank 400 may serve to change the traveling direction of light, which is emitted from the light emitting element ED (ED1, ED2) and travels toward the side surface of second bank 400, to an upward direction (for example, a display direction). That is, the second bank 400 may provide a space in which the light emitting element ED (ED1, ED2) is located, and may also serve as a reflective partition wall that changes the traveling direction of light emitted from the light emitting element ED (ED1, ED2) to the display direction.

Meanwhile, although it is shown that the side surface of the second bank 400 is inclined in a linear shape, the present disclosure is not limited thereto. For example, the side surface (or outer surface) of the second bank 400 may have a curved semi-circular or semi-elliptical shape. In some embodiments, the second bank 400 may include an organic insulating material such as polyimide (PI), but the material thereof is not limited thereto.

The plurality of electrodes 210, 220, and 230 may be located on the second bank 400 and on the via layer 190 exposed by the second bank 400. For example, the first electrode 210 may be located on the first sub-bank 410, the second electrode 220 may be located on the second sub-bank 420, and the third electrode 230 may be located on the third sub-bank 430.

Each of the first electrode 210 and the second electrode 220 may be a first type of electrode connected to the underlying circuit element layer CCL. Each of the first electrode 210 and the second electrode 220 may be connected to a part of the underlying third conductive layer 150 through electrode contact holes CT1 and CT2 penetrating the via layer 165.

For example, the first electrode 210 may be connected to the second voltage line VSL through the first electrode contact hole CT1 penetrating the via layer 165. For example, the first electrode 210 may contact the second voltage line VSL through the first electrode contact hole CT1 penetrating the via layer 165. The first electrode contact hole CT1 may overlap the first bank 600 in the third direction DR3, but the position of the first electrode contact hole CT1 is not limited thereto.

The second electrode 220 may be connected to the first conductive pattern CDP through the second electrode contact hole CT2 penetrating through the via layer 165. For example, the second electrode 220 may contact the first conductive pattern CDP through the second electrode contact hole CT2 penetrating the via layer 165. The second electrode contact hole CT2 may be spaced apart from the first electrode contact hole CT1, and may overlap the first bank 600 in the third direction DR3, but the position of the second electrode contact hole CT2 is not limited thereto.

The first electrode 210 may be electrically connected to the second voltage line VSL to allow a second power voltage to be applied to the first electrode 210, and the second electrode 220 may be electrically connected to the first transistor T1 through a first conductive pattern CDP to allow a first power voltage to be applied to the second electrode 220.

Because the first electrode 210 and the second electrode 220 are located separately for each pixel PX, the light emitting elements ED of different pixels PX may emit light individually.

The third electrode 230 may be a second type of electrode that is not connected to the underlying circuit element layer CCL. The via layer 165 may be interposed between the third electrode 230 and the third conductive layer 150 of the circuit element layer CCL, so that the third electrode 230 might not be electrically connected to the underlying circuit element layer CCL.

Hereinafter, planar shapes of the first electrode 210, the second electrode 220, and the third electrode 230 will be described. Because the planar shapes of the first electrode 210, the second electrode 220, and the third electrode 230 are similar to each other, the planar shape of the first electrode 210 will be mainly described, the planar shapes of the second electrode 220 and the third electrode 230 will be replaced with the description of the planar shape of the first electrode 210, and differences will be mainly described.

The first electrode 210 may include wide portions 211, 212, and 213 and narrow portions 214 and 215. The first electrode 210 may further include a protrusion portion 216.

The widths of the wide portions 211, 212, and 213 in the first direction DR1 may be greater than the widths of the narrow portions 214 and 215 in the first direction DR1. The first electrode 210 is generally formed of the wide portions 211, 212, and 213, but may be formed of the narrow portions 214 and 215 in the region where the first electrode 210 is cut in the process of forming alignment lines 210', 220', and 230' (to be described below), and then separating the alignment lines 210', 220', and 230' located in the defective pixel PX, and repairing these the alignment lines 210', 220', and 230'.

The wide portions 211, 212, and 213 may include a first wide portion 211, a second wide portion 212, and a third wide portion 213, which are spaced apart from each other in the second direction DR2.

The first wide portion 211 may extend in the second direction DR2, and may be formed to traverse the sub-area SA from the light emission area EMA. The first electrode 210 may generally be formed of the first wide portion 211.

The second wide portion 212 may be located to be spaced apart from the first wide portion 211 in a direction opposite to the second direction DR2. For example, the second wide portion 212 may be located at the lower side of the first wide portion 211 in a plan view. The second wide portion 212 may be located at the lower side of one pixel PX. The second wide portion 212 may be located in the non-light emission area. The second wide portion 212 may overlap the first bank 600 in the third direction DR3.

The third wide portion 213 may be located to be spaced apart from the second wide portion 212 in a direction opposite to the second direction DR2. For example, the third wide portion 213 is located at the lower side of the second wide portion 212 in a plan view, and may be located at the upper side of another pixel PX that is located adjacent to the lower side of the aforementioned one pixel PX (e.g., adjacent to the one pixel a direction opposite to the second direction DR2). The third wide portion 213 may be located in the non-light emission area of the other pixel PX that is located adjacent to the lower side of the one pixel PX. The third wide portion 213 may overlap the first bank 600 in the third direction DR3.

The narrow portions 214 and 215 may include a first narrow portion 214 and a second narrow portion 215.

The first narrow portion 214 may be located between the first wide portion 211 and the second wide portion 212. The first narrow portion 214 may be located between the first wide portion 211 and the second wide portion 212 to connect them. The first narrow portion 214 may be located at the lower side of the one pixel PX in a plan view. The first narrow portion 214 may be located in the non-light emission area. The first narrow portion 214 may overlap the first bank 600 in the third direction DR3.

The second narrow portion 215 may be located between the second wide portion 212 and the third wide portion 213. The second narrow portion 215 may be located between the second wide portion 212 and the third wide portion 213 to connect them. The second narrow portion 215 may be located at the upper side of the other pixel PX that is located adjacent to the lower side of the one pixel PX in a plan view. The second narrow portion 215 may be located in the non-light emission area of the other pixel PX located adjacent to the lower side of the one pixel PX. The second narrow portion 215 may overlap the first bank 600 in the third direction DR3.

As the widths of the first and second narrow portions 214 and 215 in the first direction DR1 is less than the widths of the first to third wide portions 211, 212, and 213 in the first direction DR1, in the repair process to be described below, a process of cutting the first and second narrow portions 214 and 215 to separate them from the alignment lines 210', 220', and 230' may be suitably performed. However, the planar shape of the first electrode 210 is not limited thereto, and the first electrode 210 may be formed of only the wide portions.

The protrusion portion 216 may be formed to protrude leftward from the first wide portion 211. The protrusion portion 216 may protrude toward the first bank 600 facing the first wide portion 211. The protrusion portion 216 may be located to overlap the first electrode contact hole CT1 in the third direction DR3. The protrusion portion 216 may be connected to the underlying second voltage line VSL through the first electrode contact hole CT1 penetrating the via layer 165.

The second electrode 220 may include wide portions 221, 222, and 223 and narrow portions 224 and 225. The planar shape of the second electrode 220 may be similar to the planar shape of the first electrode 210, except that the second electrode 220 does not include a protrusion portion. The first wide portion 221 of the second electrode 220 may be connected to the underlying first conductive pattern CDP through the second electrode contact hole CT2 penetrating the via layer 165.

The third electrode 230 may include wide portions 231, 232, and 233 and narrow portions 234 and 235. The planar shape of the third electrode 230 may be similar to the planar shape of the first electrode 210, except that the third electrode 230 does not a protrusion.

The first electrode 210 may be located on the first sub-bank 410 to cover the outer surface of the first sub-bank 410. The first electrode 210 may extend outward from the side surface of the first sub-bank 410, and may be partially located even on the upper surface of the via layer 165 exposed by the first sub-bank 410 and the second sub-bank 420.

The second electrode 220 may be located on the second sub-bank 420 to cover the outer surface of the second sub-bank 420. The second electrode 220 may extend outward from the side surface of the second sub-bank 420, and may be partially located on the upper surface of the via layer 165 having respective portions exposed by the first to third sub-banks 410, 420, and 430.

The third electrode 230 may be located on the third sub-bank 430 to cover the outer surface of the third sub-bank 430. The third electrode 230 may extend outward from the side surface of the second sub-bank 430, and may be partially located on the upper surface of the via layer 165 exposed by the second and third sub-banks 420 and 430.

The plurality of electrodes 210, 220, and 230 may be electrically connected to the light emitting elements ED. Each of the electrodes 210, 220, and 230 may be connected to respective ends of respective light emitting elements ED through contact electrodes 710, 720, and 730 to be described below, and may transmit an electric signal applied from the third conductive layer 150 to the light emitting elements ED. Electric signals for allowing the light emitting elements ED to emit light may be directly applied to the first electrode 210 and the second electrode 220, and might not be applied to the third electrode 230.

Each of the plurality of electrodes 210, 220, and 230 may include a conductive material having high reflectance. For example, each of the plurality of electrodes 210, 220, and 230 may include a metal such as silver (Ag), copper (Cu), and/or aluminum (Al), or may include an alloy containing aluminum (Al), nickel (Ni), and/or lanthanum (La), as the conductive material having high reflectance. Each of the plurality of electrodes 210, 220, and 230 may reflect light, which is emitted from the light emitting element ED and traveling toward the side surface of the second bank 400, in the upward direction of each sub-pixel PX.

However, the present disclosure is not limited thereto, and each of the plurality of electrodes 210, 220, and 230 may further include a transparent conductive material. For example, each of the plurality of electrodes 210, 220, and 230 may include a material such as ITO, IZO, and/or ITZO. In some embodiments, each of the plurality of electrodes 210, 220, and 230 may have a structure in which one or more transparent conductive material layers and one or more metal layers having high reflectance are stacked, or may be formed as one layer including these layers. For example, each of the plurality of electrodes 210, 220, and 230 may have a stacked structure of ITO/Ag/ITO/, ITO/Ag/IZO, and/or ITO/Ag/ITZO/IZO.

The repair line 240 may be located on the via layer 165. The repair line 240 may be formed on the same layer as the plurality of electrodes 210, 220, and 230. However, the present disclosure is not limited thereto, and the repair line 240 may be formed on a different layer from the plurality of electrodes 210, 220, and 230.

The repair connection portion 250 may be located between the first wide portion 231 of the third electrode 230 and the repair line 240 to connect them. The repair connection portion 250 may be located on a part of the third sub-bank 430 and on the via layer 165 exposed by the second bank 400. Meanwhile, although it is shown that the repair connection portion 250, the repair line 240, and the third electrode 230 are formed integrally on the same layer, the present disclosure is not limited thereto. For example, the repair line 240 and the third electrode 230 may be formed on the same layer, the repair connection portion 250 may be formed on a different layer, and the repair connection portion 250 may contact the repair line 240 and a part of the third electrode 230, respectively, to connect them.

The first insulating layer 510 may be located on the plurality of electrodes 210, 220, 230, the repair line 240, and the repair connection portion 250. The first insulating layer 510 may be located to entirely cover the plurality of electrodes 210, 220, 230, the repair line 240, and the repair connection portion 250, and may protect the plurality of electrodes 210, 220, 230, the repair line 240, and the repair connection portion 250, and may insulate them from each other. Further, the first insulating layer 510 may reduce or prevent the likelihood of damage to the light emitting element ED located on the first insulating layer 510 due to direct contact with other members.

The first insulating layer 510 may be located on the first electrode 210 and the second electrode 220, and may include a first opening OP11 and a second opening OP12 penetrating the first insulating layer 510 and respectively exposing at least a part of the first electrode and at least a part of the second electrode 220. The first opening OP11 may expose a part of the upper surface of the first electrode 210, and the second opening OP12 may expose a part of the upper surface of the second electrode 220. The first opening OP11 and the second opening OP12 may be located in the sub-area SA. The first and second electrodes 210 and 220 may be respectively electrically connected to the first and second contact electrodes 710 and 720 (described further below) through the first opening OP11 and the second opening OP12 in the sub-area SA.

The first bank 600 may be located on the first insulating layer 510. The first bank 600 may be located in a grid pattern by including portions extending in the first direction DR1 and in the second direction DR2 in a plan view. As described above, the first bank 600 may be located to completely cover the repair line 240.

The first bank 600 may be located across the boundary of the respective pixels PX to divide neighboring pixels PX, and to divide the light emission areas EMA and the sub-areas SA. Further, the first bank 600 may be formed to have a height that is greater than that of the second bank 400, and may divide the areas so that the ink in which the light emitting elements ED are dispersed is not mixed into adjacent pixels PX, but instead is injected into the light emission area EMA in the inkjet printing process for aligning the light emitting elements ED during the process of manufacturing the display device 10.

The light emitting element ED may be located on the first insulating layer 510. The plurality of light emitting elements ED are located to be spaced apart from each other along the second direction DR2 in which the electrodes 210, 220, and 230 extend, and may be substantially aligned in parallel with each other.

The light emitting element ED may include semiconductor layers doped with different conductivity types. The light emitting element ED may include a plurality of semiconductor layers to be oriented such that one end of the light emitting element ED faces a corresponding (e.g., specific) direction according to a direction of an electric field generated on the first to third electrodes 210, 220, and 230. Further, the light emitting element ED may include a light emitting layer, or element active layer, (e.g., see reference character "33" in FIG. 8) to emit light in a corresponding (e.g., specific) wavelength band. The light emitting elements ED located in each pixel PX may emit light of different wavelength bands depending on the material constituting the light emitting layer/element active layer 33. However, the present disclosure is not limited thereto, and the light emitting elements ED located in each pixel PX may emit light of the same color.

The light emitting elements ED may be located between the first to third sub-banks 410, 420, and 430. The light emitting elements ED may be located on the first insulating layer 510 such that respective ends of the light emitting element ED are located on respective ones of the first to third electrodes 210, 220, and 230, respectively. The ends of the light emitting element ED may be located on the first electrode 210 and the second electrode 220, respectively, or the ends thereof may be located on the second electrode 220 and the third electrode 230, respectively.

The light emitting element ED may include a first light emitting element ED1 and a second light emitting element ED2. The first light emitting element ED1 may be a light emitting element having both ends located on the first electrode 210 and the second electrode 220, respectively, between the first sub-bank 410 and the second sub-bank 420, and the second light emitting element ED2 may be a light emitting element having both ends located on the second electrode 220 and the third electrode 230, respectively, between the second sub-bank 420 and the third sub-bank 430.

The light emitting element ED includes a plurality of semiconductor layers. A first end, and a second end opposite to the first end, may be defined based on any one semiconductor layer. The light emitting element ED may be located such that each of the first end and the second end is placed on a corresponding (e.g., specific) electrode. For example, the first light emitting device ED1 may be located such that the first end thereof is placed on the first electrode 210 and the second end thereof is placed on the second electrode 220. The second light emitting element ED2 may be located such that the first end thereof is located on the third electrode 230 and the second end thereof is located on the second electrode 220. The alignment process of the light emitting element ED may be performed using a dielectrophoretic force due to an electric field formed by applying an alignment signal to alignment lines to be described below.

The second insulating layer 520 may be partially located on the light emitting element ED. The second insulating layer 520 may be located to partially surround the outer surface of the light emitting element ED so as not to cover the first end and the second end of the light emitting element ED. A portion of the second insulating layer 520, the portion being located on the light emitting element ED, may be located to extend in the first direction DR1 on the first insulating layer 510 in a plan view, thereby forming a linear pattern or an island-shaped formation within each pixel PX. The second insulating layer 520 may serve to protect the light emitting element ED, and to fix the light emitting element ED in the process of manufacturing the display device 10.

In some embodiments, as described above, the material constituting the second insulating layer 520 may be located between the first electrode 210 and the second electrode 220, and between the second electrode 220 and the third electrode 230, and may fill an empty space formed by being recessed between the first insulating layer 510 and the light emitting element ED.

The second insulating layer 520 may be further located on the first insulating layer 510 and on the first and second banks 600 and 400. The second insulating layer 520 may be located to substantially cover the first insulating layer 510, but may be located to expose both ends of the light emitting element ED. Further, in the sub-area SA, the second insulating layer 520 may expose a part of the first electrode 210 and a part of the second electrode 220 together with the first and second openings OP11 and OP12 penetrating the first insulating layer 510. The planar shape of the second insulating layer 520 may be formed by a process of entirely placing the second insulating layer 520 on the first insulating layer 510, and then removing the second insulating layer 520 to expose both ends of the light emitting element ED and parts of the first and second electrodes 210 and 220 during the process of manufacturing the display device 10.

A plurality of contact electrodes 710, 720, and 730 may be located on the second insulating layer 520. The plurality of contact electrodes 710, 720, and 730 may include a first contact electrode 710, a second contact electrode 720, and a third contact electrode 730. The first to third contact electrodes 710, 720, and 730 may be located to be spaced apart from each other.

The first contact electrode 710 may be located on the first electrode 210. The first contact electrode 710 may have a shape extending in the second direction DR2. The first contact electrode 710 may be in contact with the first electrode 210 and the first end of the first light emitting element ED1. The first contact electrode 710 may be in contact with the first electrode 210 exposed by the first opening OP11 included in the first insulating layer 510 and the second insulating layer 520 in the sub-area SA, and may be in contact with the first end of the first light emitting element ED1 exposed by the second insulating layer 520 in the light emission area EMA. The first contact electrode 710 may serve to electrically connect the first end of the first light emitting element ED1 and the first electrode 210.

The second contact electrode 720 may be located on the second electrode 210. The second contact electrode 720 may have a shape extending in the second direction DR2. The second contact electrode 720 may be in contact with the second electrode 220 and the second end of the second light emitting element ED2, respectively. The second contact electrode 720 may be in contact with the second electrode 220 exposed by the second opening OP12 included in the first insulating layer 510 and the second insulating layer 520 in the sub-area SA, and may be in contact with the second end of the second light emitting element ED2 exposed by the second insulating layer 520 in the light emission area EMA. The second contact electrode 720 may serve to electrically connect the second end of the second light emitting element ED2 and the second electrode 220.

The third contact electrode 730 may be located on the second electrode 220 and the third electrode 230 in the light emission area EMA. The third contact electrode 730 may include a first region 731, a second region 732, and a third region 733.

The first region 731 of the third contact electrode 730 may be located on the second electrode 220. The first region 731 of the third contact electrode 730 may have a shape extending in the second direction DR2. The first region 731 of the third contact electrode 730 may be located on the second electrode 220 to be spaced apart from the second contact electrode 720. The first region 731 of the third contact electrode 730 may contact the second end of the first light emitting element ED1.

The second region 732 of the third contact electrode 730 may be located on the third electrode 230. The second region 732 of the third contact electrode 730 may have a shape extending in the second direction DR2. The second region 732 of the third contact electrode 730 may contact the first end of the second light emitting element ED2.

The third region 733 of the third contact electrode 730 may be located between the first region 731 of the third contact electrode 730 and the second region 732 of the third contact electrode 730. The third region 733 of the third contact electrode 730 may be located between the first region 731 of the third contact electrode 730 and the second region 732 of the third contact electrode 730 to connect them.

The first to third regions 731, 732, and 733 of the third contact electrode 730 may be formed integrally with each other.

The first light emitting element ED1 and the second light emitting element ED2 may be electrically connected to each other through the third contact electrode 730. For example, an electric signal applied through the second contact electrode 720 may be transmitted to the first light emitting element ED1 through the second light emitting element ED2 and the third contact electrode 730. The first light emitting element ED1 and second light emitting element ED2 located in one pixel PX may be connected in series to each other through the third contact electrode 730.

The first contact electrode 710 and the first region 731 of the third contact electrode 730 may be located to be spaced apart from each other on the second insulating layer 520 located on the first light emitting element ED1. Further, the second contact electrode 720 and the second region 732 of the third contact electrode 730 may be located to be spaced apart from each other on the second insulating layer 520 located on the second light emitting element ED2.

The first to third contact electrodes 710, 720, and 730 may include a conductive material. For example, the first to third contact electrodes 710, 720, and 730 may include ITO, IZO, ITZO, or aluminum (Al).

A third insulating layer 540 may be further located on the first to third contact electrodes 710, 720, and 730. The third insulating layer 540 may be entirely located on the substrate SUB to function to protect the members located thereon from external environments.

Figure 8:
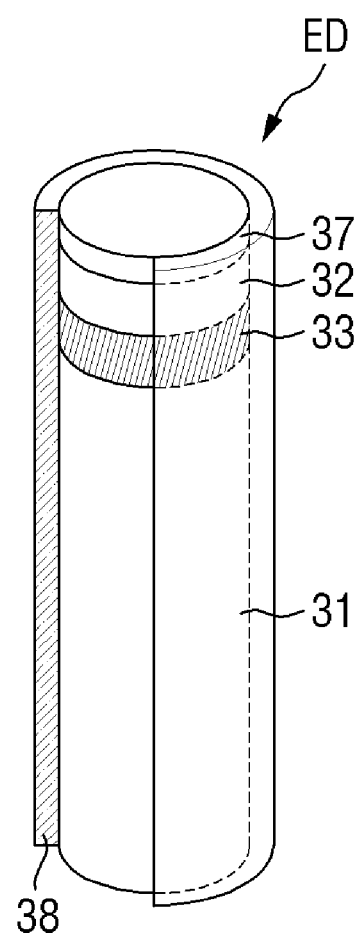
FIG. 8 is a schematic view of a light emitting element according to some embodiments.

FIG. 8 is a schematic view of a light emitting element according to some embodiments.

Referring to FIG. 8, the light emitting element ED is a particulate element, and may have a rod shape or a cylindrical shape having an aspect ratio (e.g., a predetermined aspect ratio). The length of the light emitting element ED is larger than the diameter of the light emitting element ED, and the aspect ratio thereof may be about 1.2:1 to about 100:1, but is not limited thereto.

The light emitting element ED may have a size of a nano-meter scale (about 1 nm or more and less than about 1 μm) to a micrometer scale (about 1 μm or more and less than about 1 mm). In some embodiments, both diameter and length of the light emitting element ED may have a size of a nanometer scale, or may have a size of a micrometer scale. In some embodiments, the diameter of the light emitting element ED may have a size of a nanometer scale, while the length of the light emitting element ED may have a size of a micrometer scale. In some embodiments, some of the light emitting elements ED may have a size of a nanometer scale in diameter and/or length, while others of the light emitting elements ED may have a size of a micrometer scale in diameter and/or length.

In some embodiments, the light emitting element ED may be an inorganic light emitting diode. The inorganic light emitting diode may include a plurality of semiconductor layers. For example, the inorganic light emitting diode may include a first conductive (for example, n-type) semiconductor layer, a second conductive (for example, p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons having reached the active semiconductor layer may be combined with each other to emit light.

In some embodiments, the above-described semiconductor layers may be sequentially stacked along the length direction of the light emitting element ED. As shown in FIG. 8, the light emitting element ED may include a first semiconductor layer 31, an element active layer 33, and a second semiconductor layer 32, which are sequentially stacked in the length direction. The first semiconductor layer 31, the element active layer 33, and the second semiconductor layer 32 may be the above-described first conductive semiconductor layer, active semiconductor layer, and second conductive semiconductor layer, respectively.

The first semiconductor layer 31 may be doped with a first conductive dopant. The first conductive dopant may be Si, Ge, Sn, or the like. In some embodiments, the first semiconductor layer 31 may be n-GaN doped with n-type Si.

The second semiconductor layer 32 may be located to be spaced apart from the first semiconductor layer 31 with the element active layer 33 interposed therebetween. The second semiconductor layer 32 may be doped with a second conductive dopant such as Mg, Zn, Ca, Se, or Ba. In some embodiments, the second semiconductor layer 32 may be p-GaN doped with p-type Mg.

The element active layer 33 may include a material having a single or multiple quantum well structure. As described above, the element active layer 33 may emit light by combination of an electron-hole pair according to an electric signal applied through the first semiconductor layer 31 and the second semiconductor layer 32.

In some embodiments, the element active layer 33 may have a structure in which semiconductor materials having high band gap energy and semiconductor materials having low band gap energy are alternately stacked with each other, and may include other Group 3 to Group 5 semiconductor materials depending on the wavelength band of emitted light.

Light emitted from the element active layer 33 may be emitted not only to the outer surface of the light emitting element ED in the longitudinal direction, but also to both side surfaces thereof. That is, the direction of light emitted from the element active layer 33 is not limited to one direction.

The light emitting element ED may further include an element electrode layer 37 located on the second semiconductor layer 32. The element electrode layer 37 may be in contact with the second semiconductor layer 32. The element electrode layer 37 may be an ohmic contact electrode, but is not limited thereto, and may be a Schottky contact electrode.

When both ends of the light emitting element ED is electrically connected to the contact electrodes 710 and 720 so as to apply electric signals to the first and second semiconductor layers 31 and 32, the element electrode layer 37 may be located between the second semiconductor layer 32 and the contact electrodes 710 and 720 to reduce resistance. The element electrode layer 37 may include at least one of aluminum (Al), titanium (Ti), indium (In), gold (Au), silver (Ag), indium tin oxide (ITO), indium zinc oxide (IZO), and/or indium tin-zinc oxide (ITZO). The element electrode layer 37 may include a semiconductor material doped with an n-type or p-type dopant.

The light emitting element ED may further include an element insulating layer 38 surrounding the outer peripheral surfaces of the first semiconductor layer 31, the second semiconductor layer 32, the element active layer 33 and/or the element electrode layer 37. The element insulating layer 38 may be located to surround at least an outer surface of the element active layer 33, and may extend in one direction in which the light emitting element ED extends. The element insulating layer 38 may perform a function of protecting the members. The element insulating layer 38 is made of a material having insulating properties, and may prevent an electric short that may occur when the element active layer 33 is in direct contact with an electrode through which an electric signal is transmitted to the light emitting element ED. Further, because the element insulating layer 38 protects the outer peripheral surfaces of the first and second semiconductor layers 31 and 32 and the element active layer 33, it is possible to reduce or prevent a decrease in light emission efficiency.

Figure 9:
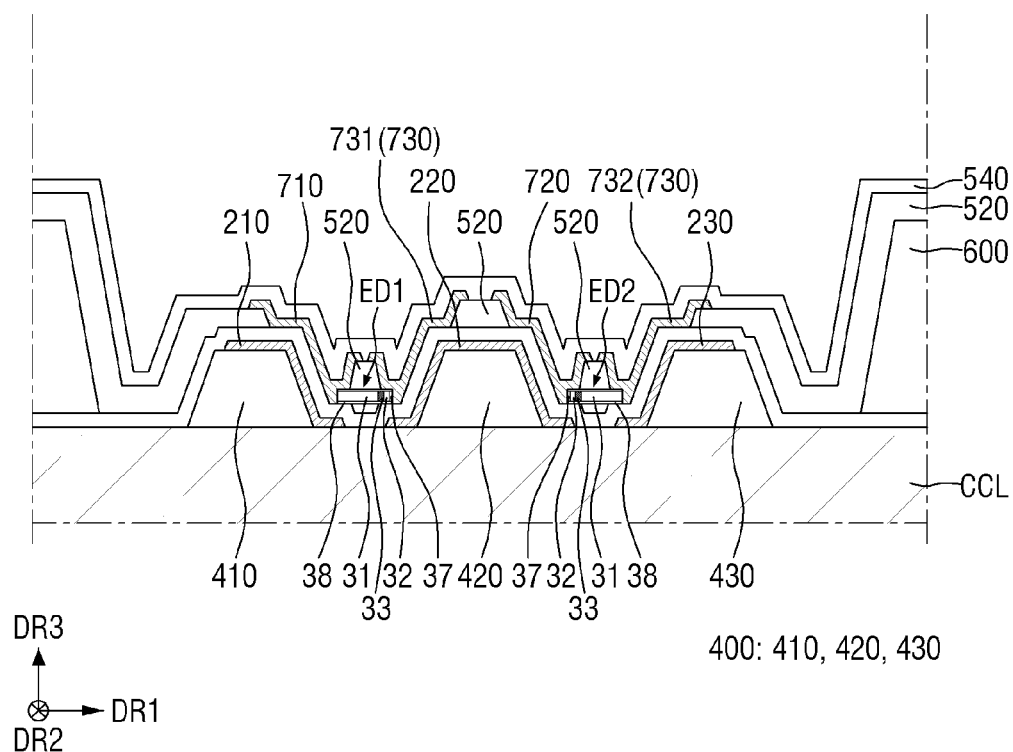
FIG. 9 is a cross-sectional view illustrating an example of a light emission area of a display device according to some embodiments.

FIG. 9 is a cross-sectional view illustrating an example of a light emission area of a display device according to some embodiments.

Referring to FIG. 9, the light emitting element ED may be located such that the extending direction thereof is parallel to the upper surface of the substrate SUB. The plurality of semiconductor layers included in the light emitting element ED may be sequentially arranged along a direction parallel to the upper surface of the substrate SUB. For example, the first semiconductor layer 31, the element active layer 33, and the second semiconductor layer 32 of the light emitting element ED may be sequentially arranged to be parallel to the upper surface of the substrate SUB.

For example, in the light emitting element ED, the first semiconductor layer 31, the element active layer 33, the second semiconductor layer 32, and the element electrode layer 37 may be sequentially formed in a direction horizontal to the upper surface of the substrate SUB1 in a cross section traversing both ends of the light emitting element ED.

Hereinafter, in this specification, the end at which the first semiconductor layer 31 of the light emitting element ED is located may be defined as a first end, and the end opposite thereto (or the end at which the second semiconductor layer 32 is located) may be defined as a second end.

The first light emitting element ED1 may be aligned such that the first end is placed on the first electrode 210 and the second end is placed on the second electrode 220. The second light emitting element ED2 may be aligned such that the first end is placed on the third electrode 230 and the second end is placed on the second electrode 220. However, the present disclosure is not limited thereto. The first light emitting element ED1 may be aligned such that the first end is placed on the second electrode 220 and the second end is placed on the first electrode 210, and the second light emitting element ED2 may be aligned such that the first end is placed on the second electrode 220 and the second end is placed on the third electrode 230. The alignment of the plurality of light emitting elements ED may be determined according to an alignment signal applied to alignment lines in an alignment process to be described below.

Both ends of the first light emitting element ED1 exposed by the second insulating layer 520 may contact the first contact electrode 710 and the third contact electrode 730 (e.g., the first region 731 of the third contact electrode 730).

The first contact electrode 710 may contact the first end of the first light emitting element ED1. The first contact electrode 710 may contact the first semiconductor layer 31 located at the first end of the first light emitting element ED1.

The first region 731 of the third contact electrode 730 may contact the second end of the first light emitting element ED1. The first region 731 of the third contact electrode 730 may be electrically connected to the second semiconductor layer 32 through the element electrode layer 37 located at the second end of the first light emitting element ED1.

Both ends of the second light emitting element ED2 exposed by the second insulating layer 520 may contact the second contact electrode 720 and the third contact electrode 730 (e.g., the second region 732 of the third contact electrode 730).

The second region 732 of the third contact electrode 730 may contact the first end of the second light emitting element ED2. The second region 732 of the third contact electrode 730 may contact the first semiconductor layer 31 placed at the first end of the second light emitting element ED2.

The second contact electrode 720 may contact the second end of the second light emitting element ED2. The second contact electrode 720 may be electrically connected to the second semiconductor layer 32 through the element electrode layer 37 located at the second end of the second light emitting element ED2.

The second end of the second light emitting element ED2 may be connected to the second electrode 220 through the second contact electrode 720, the first end of the second light emitting element ED2 and the second end of the first light emitting element ED1 may be connected in series to each other through the third contact electrode 730, and the first end of the first light emitting element ED1 may be connected to the first electrode 210 through the first contact electrode 710. That is, the second end of the second light emitting element ED2 and the first end of the first light emitting element ED1 may receive electric signals from the second electrode 220 and the first electrode 210 through the second contact electrode 720 and the first contact electrode 710, respectively, and the first end of the second light emitting element ED2 and the second end of the first light emitting element ED1 may be connected to each other through the third contact electrode 730, so that each of the first light emitting element ED1 and second light emitting element and ED2 may emit light from the element active layer 33 according to the electric signals.

FIGS. 10 to 21 are schematic views illustrating a part of a method of manufacturing a display device according to some embodiments.

Figure 10:
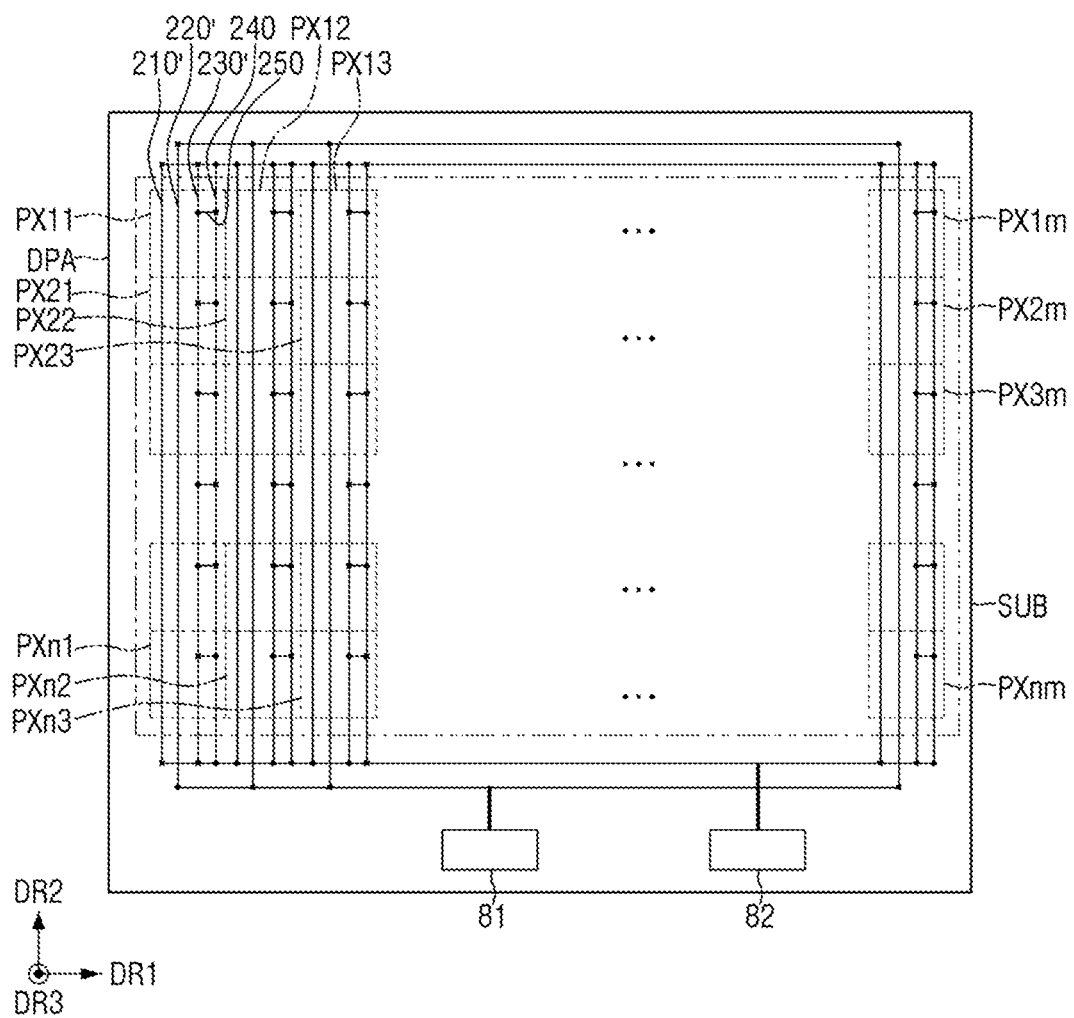
FIGS. 10 to 21 are schematic views illustrating a part of a method of manufacturing a display device according to some embodiments.

FIG. 10 illustrates a connection relationship between a plurality of alignment lines used in a process for aligning a plurality of light emitting elements during a process of manufacturing a display device.

Referring to FIG. 10, as described above, the display area DPA of the display device 10 may include a plurality of pixels PX. The plurality of pixels PX may be arranged in a matrix direction. For example, the plurality of pixels PX may be arranged in first to n-th rows and first to m-th columns (where n and m are each a natural number). In this specification, the row direction may be referred to as the first direction DR1, and the column direction may be referred to as the second direction DR2.

Before the process of aligning the plurality of light emitting elements ED, a plurality of alignment lines 210', 220', and 230' and a repair line 240 may be formed on the substrate SUB.

The plurality of alignment lines 210', 220', and 230' may include a first alignment line 210', a second alignment line 220', and a third alignment line 230'. The first alignment line 210', the second alignment line 220', and the third alignment line 230' may extend along the second direction DR2, and may be located for each column of the pixel PX. For example, the same first to third alignment lines 210', 220', and 230' may be located in the pixels PX positioned in the same column, and different first to third alignment lines 210', 220', and 230' may be located in the pixels PX positioned in different columns.

The first alignment line 210', the second alignment line 220', and the third alignment line 230' may be located to be spaced apart from each other in the first direction DR1. The first alignment line 210', the second alignment line 220', and the third alignment line 230' may correspond to the first electrode 210, the second electrode 220, and third electrode 230, may extend in the second direction DR2, and may be connected to the neighboring pixels PX in the second direction DR2.

The repair line 240, like the plurality of alignment lines, may extend along the second direction DR2, and may be located for each column of the pixel PX. For example, the same repair lines 240 may be located in the pixels PX positioned in the same column, and different repair lines 240 may be located in pixels PX positioned in different columns.

Meanwhile, the repair line 240 may be connected to the third alignment line 230'. The repair line 240 may be connected to the third alignment line 230' through the repair connection portion 250. The repair connection portion 250 may be located for each pixel PX to connect the repair line 240 and the third alignment line 230'.

The first alignment line 210', the third alignment line 230', and the repair line 240' may be connected to each other. The first alignment line 210', the third alignment line 230', and the repair line 240 may be connected to each other such that the same alignment signal may be applied thereto. The first alignment line 210', the third alignment line 230', and the repair line 240 located in the pixels PX of different columns are also connected to each other, and the same alignment signal may be applied to the first alignment line 210', the third alignment line 230', and the repair line 240 in different columns. For example, the first alignment lines 210', the third alignment lines 230', and the repair lines 240 respectively located in the pixels PX in the first to m-th columns are connected to each other, so that a first alignment signal may be applied thereto through a first alignment pad 82.

The second alignment lines 220' located in the pixels PX in different columns may be connected to each other. The second alignment lines 220' located in the pixels PX in different columns are connected to each other, so that the same alignment signal may be applied thereto. For example, the second alignment lines 220' located in the pixels PX in the first to m-th columns are connected to each other, so that a second alignment signal may be applied thereto through a second alignment pad 81.

According to the first alignment signal applied through the first alignment pad 82 and the second alignment signal applied through the second alignment pad 81, the first end and the second end of the light emitting element ED may be aligned to be placed on corresponding (e.g., specific) alignment lines, respectively.

The repair connection portion 250 may be located for each of the plurality of pixels PX to connect the third alignment line 230' and the repair line 240 in the same column. As will be described below, despite the separation of the third alignment line 230' in the process of repairing the defective pixel, the repair connection portion 250 may be located for each row to connect the third alignment line 230' and the repair line 240 of a normal pixel located in the same column as the defective pixel. Accordingly, even though the third alignment line 230' is separated, the first alignment signal may be transmitted to the third alignment line 230' of the normal pixel through the repair line 240 and the repair connection portion 250.

Figure 19:
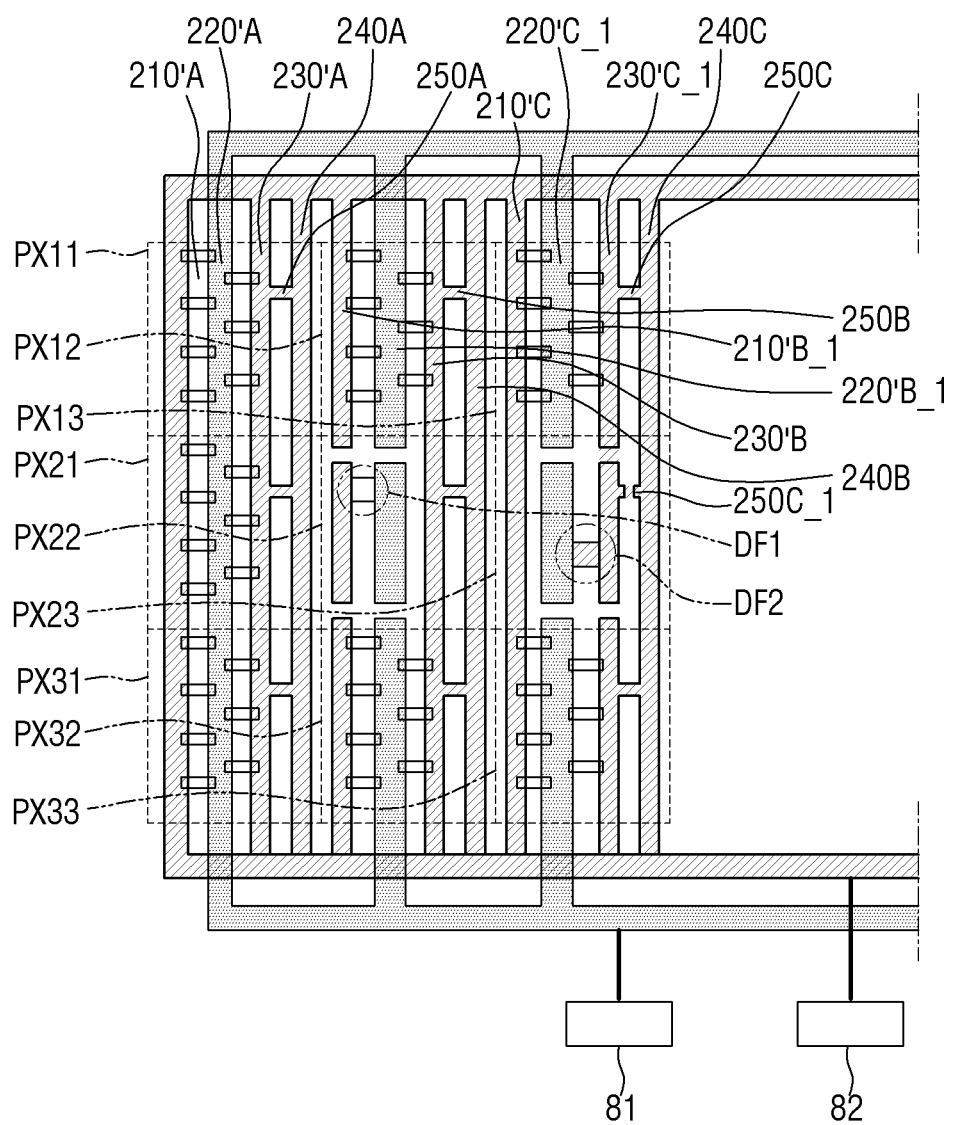
Figure 20:
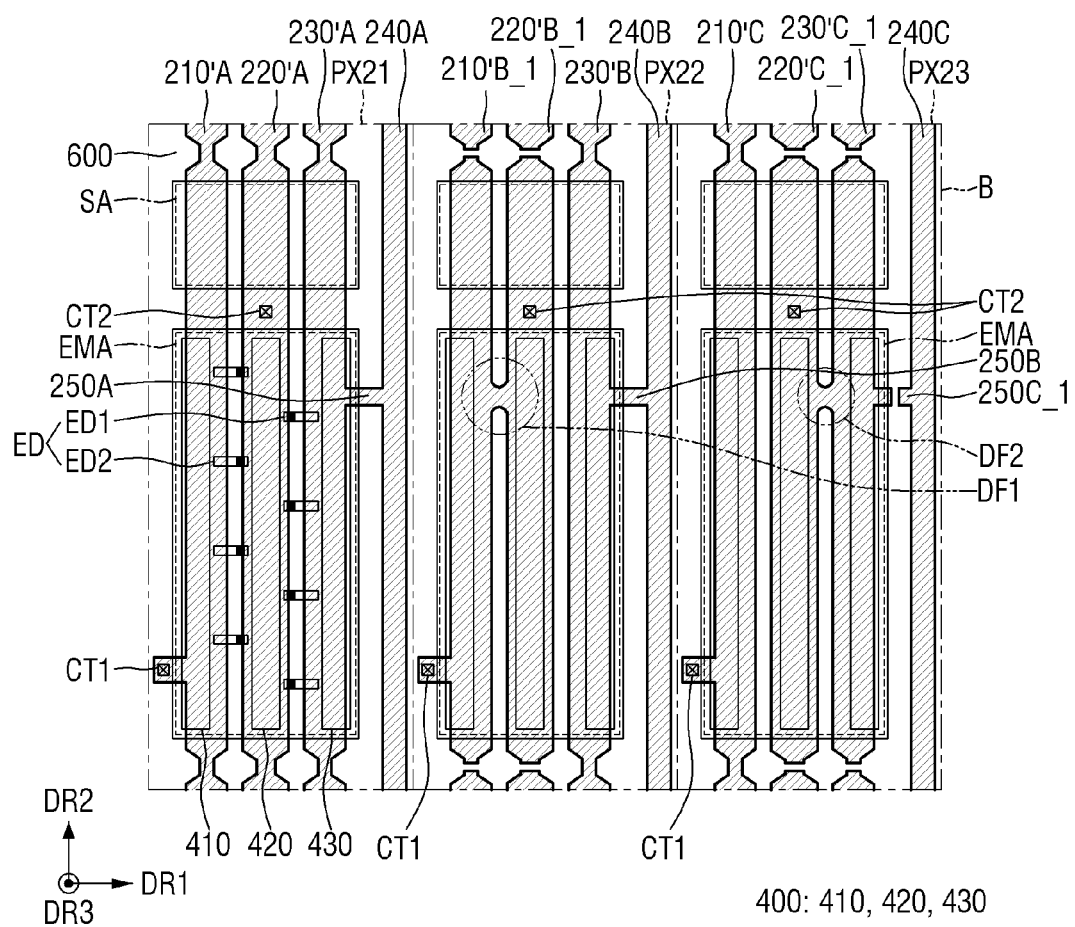
Figure 21:
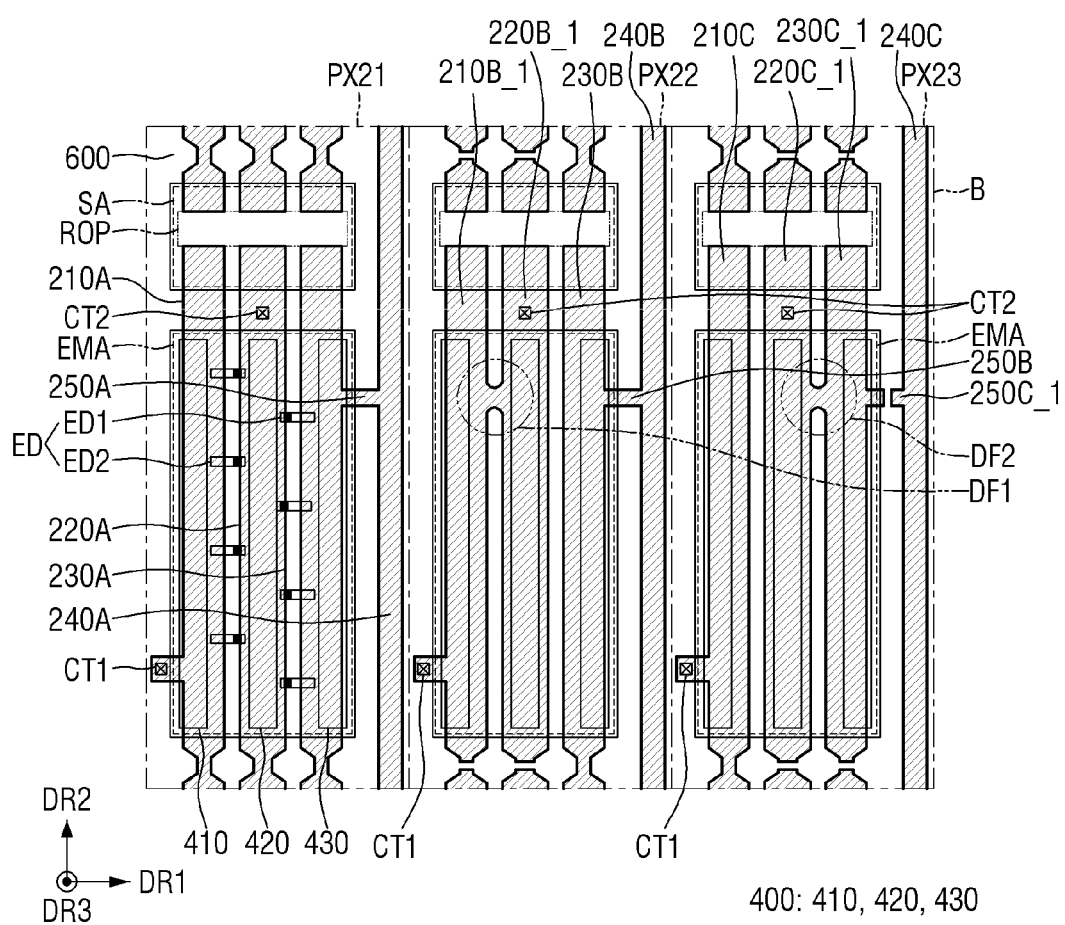

FIGS. 11 to 14 illustrate a process of repairing a plurality of alignment lines during a process of manufacturing a display device, FIGS. 16 to 20 illustrate a process of aligning a plurality of light emitting elements during a process of manufacturing a display device, and FIG. 21 illustrates a process of forming a plurality of electrodes by disconnecting a plurality of alignment lines during a process of manufacturing a display device.

Hereinafter, a method of manufacturing the display device 10 will be described with reference to FIGS. 6, 7, and 10.

Figure 11:
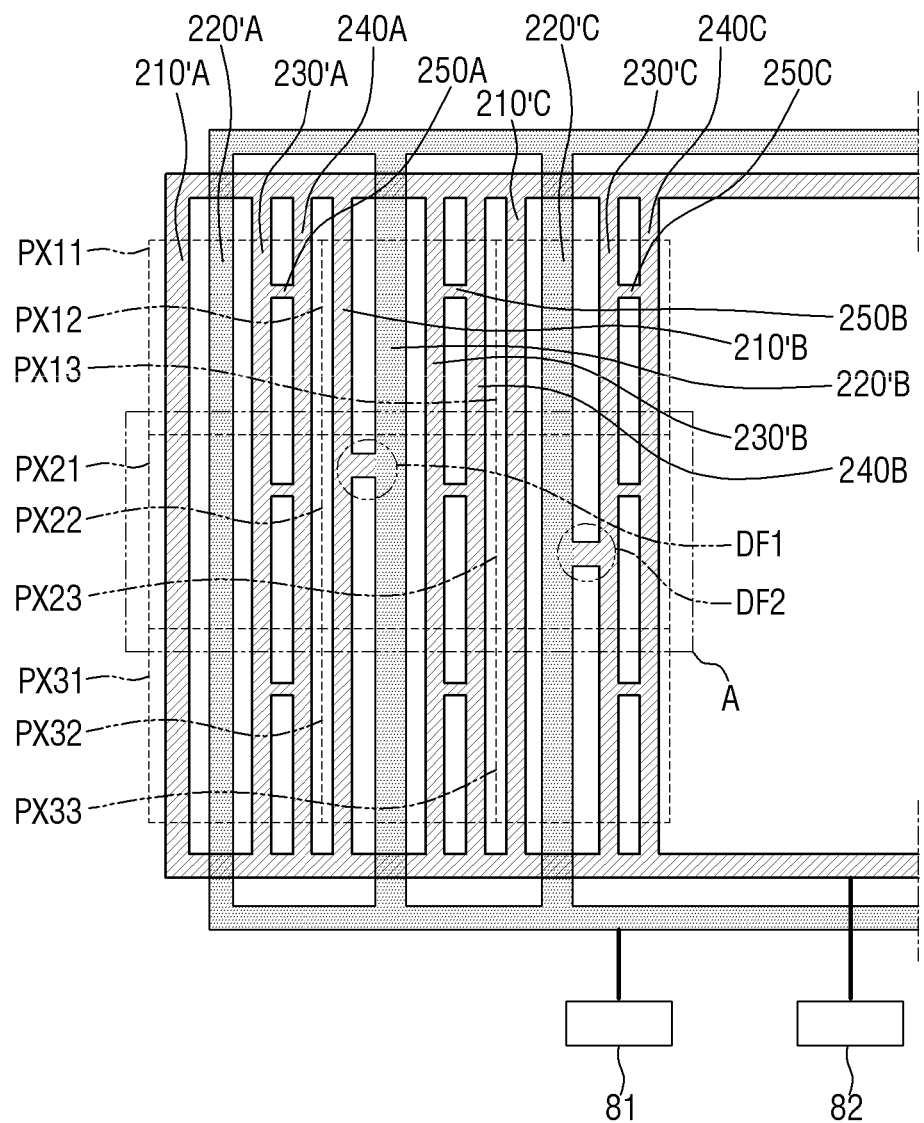
Figure 12:
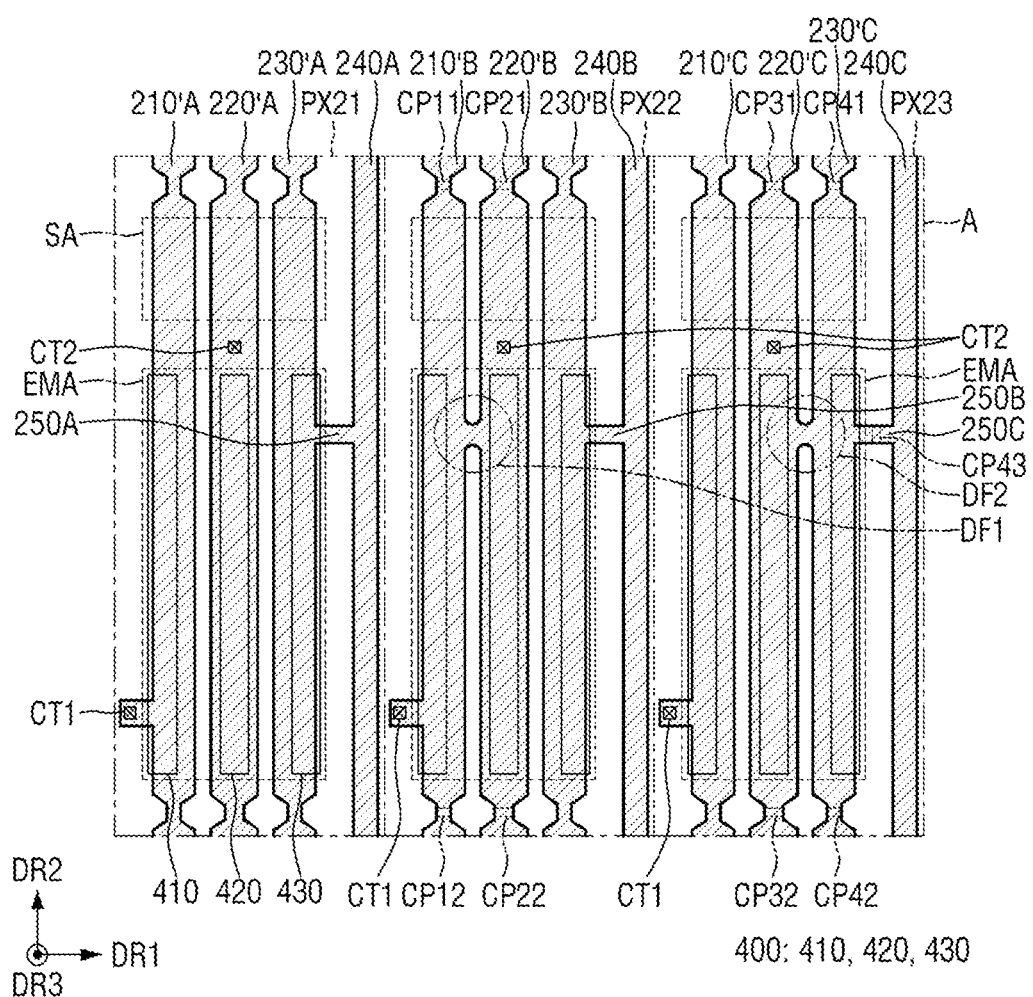

FIG. 11 is a layout view illustrating an example in which a plurality of alignment lines 210', 220', and 230', a repair line 240 and a plurality of repair connection portions 250 are formed on a substrate SUB, and FIG. 12 is an enlarged plan view of the area A in FIG. 11.

Hereinafter, for convenience of description, a plurality of pixels arranged in a matrix direction of 3×3 (that is, first to third rows and first to third columns) will be described merely as an example. However, these drawings are for explaining a method of repairing a plurality of alignment lines during a process of manufacturing a display device, and the number of pixels is not limited thereto.

Referring to FIGS. 11 and 12, first, a second bank 400 including first to third sub-banks 410, 420, and 430 is formed on a substrate SUB. Subsequently, a plurality of alignment lines 210', 220', and 230', a repair line 240 and a plurality of repair connection portions 250 are formed on the first to third sub-banks 410, 420, and 430.

The first to third alignment lines 210', 220', and 230' correspond to the first to third electrodes 210, 220 and 230 respectively, but may extend in the second direction DR2 such that they are not separated from each other. In this process, the first alignment line 210' corresponding to the first electrode 210 may be connected to the second voltage line VSL of the circuit element layer CCL through the first electrode contact hole CT1 of each pixel PX. Further, the second alignment line 220' corresponding to the second electrode 220 may be connected to the first conductive pattern CP1 of the circuit element layer CCL through the second electrode contact hole CT2 of each pixel PX. In contrast, as described above, the third alignment line 230' corresponding to the third electrode 230 may not be connected to the underlying circuit element layer CCL.

Hereinafter, because the structure and arrangement of the first to third alignment lines 210', 220', and 230', the repair line 240 and the plurality of repair connection portions 250 have been described above, a detailed description thereof will be omitted, and a process of manufacturing a display device will be mainly described.

Subsequently, a defect inspection of the alignment lines located on the plurality of pixels PX is performed. The defect inspection may be performed using a high-resolution camera, but the present disclosure is not limited thereto.

For example, as shown in FIGS. 11 and 12, a first defect DF1 in which the first alignment line 210'B of the second column and the second alignment line 220'B of the second column are shorted to each other in the first defective pixel PX22 located at 2×2 (e.g., at the second row and at the second column) may occur. Further, a second defect DF2 in which the second alignment line 220'C of the third column and the third alignment line 230'C of the third column are shorted to each other in the second defective pixel PX23 located at 2×3 (e.g., at the second row and at the third column) may occur.

Like the first defect DF1 and the second defect DF2, when the second alignment line 220', the first alignment line 210', and/or the third alignment line 230' are integrated with each other to cause a short, the above-described first alignment signal and second alignment signal may not be applied to the corresponding alignment lines. In this case, because electric fields are not formed between the first alignment line 210' and the second alignment line 220' or between the second alignment line 220' and the third alignment line 230', respectively, the alignment of the light emitting elements ED may be defective, and thus display quality of the display device may be deteriorated. Accordingly, to improve the reliability of the alignment process of the light emitting element ED, it is suitable to repair the alignment lines of the defective pixels such that the first alignment signal and the second alignment signal are applied to the corresponding alignment lines.

Subsequently, a process of repairing the plurality of alignment lines 210', 220', and 230' is performed.

Figure 13:
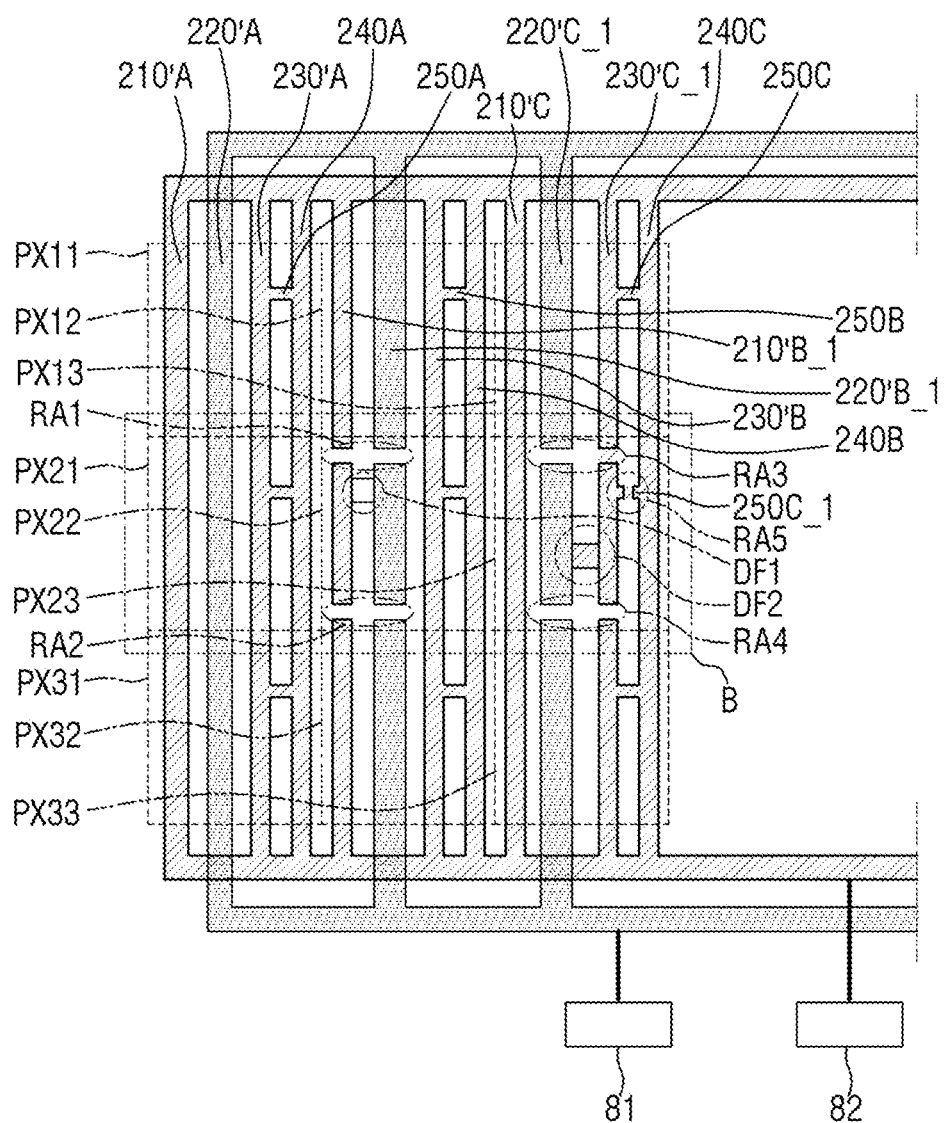
Figure 14:
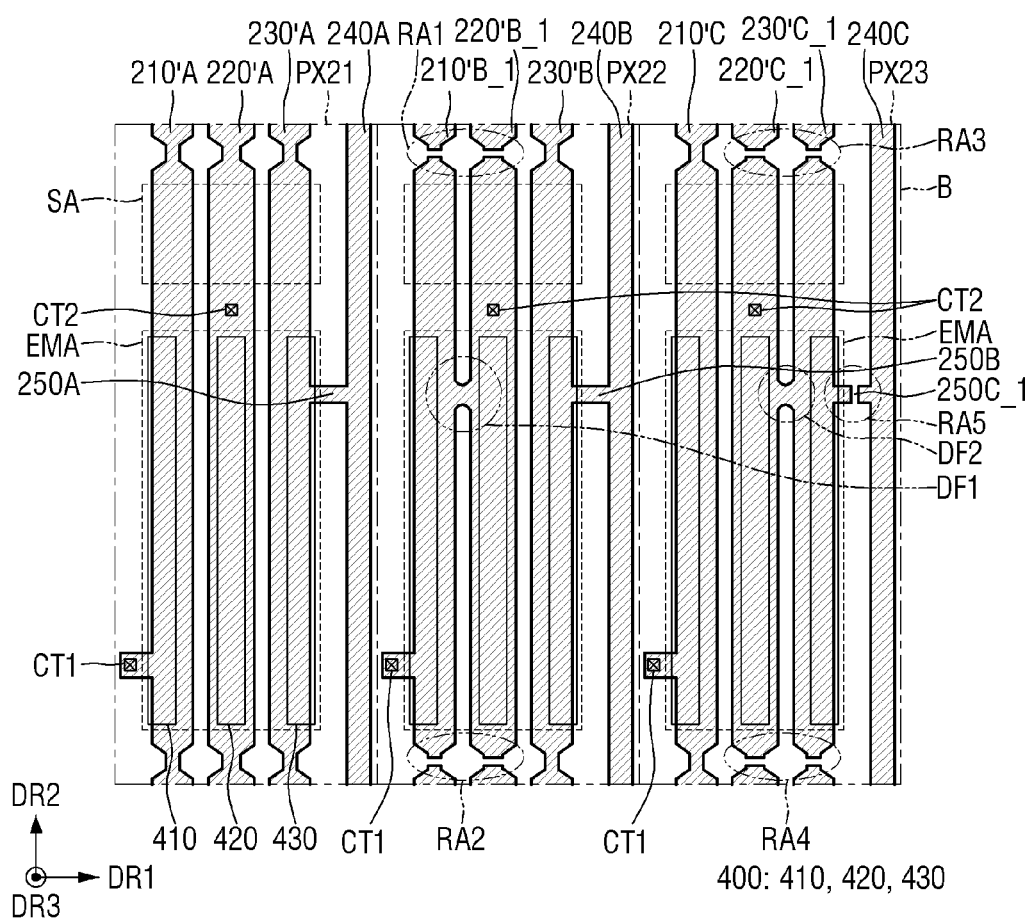

As shown in FIGS. 13 and 14, in the repair method, when the defective alignment lines are the first alignment line 210' and the second alignment line 220', the narrow portions located at the upper and lower sides of the first alignment line 210' and the second alignment line 220' located in the defective pixel PX may be cut to separate the defective pixel PX from the pixels PX located adjacent to each other in the second direction DR2. Further, when the defective alignment line is the third alignment line 230', the narrow portions located at the upper and lower sides of the third alignment line 230' located in the defective pixel PX may be cut to separate the defective pixel PX from the pixels PX located adjacent to each other in the second direction DR2, and the repair connection portion 250 located in the defective pixel PX may be cut to separate the defective pixel PX from the repair line 240. For the repair of the alignment lines, the cutting process may be performed using a laser, but the present disclosure is not limited thereto.

For example, referring to FIG. 12, in the first defective pixel PX22, the narrow portions CP11 and CP12 at the upper and lower sides of the first alignment line 210'B in the second row may be cut, respectively, and the portions CP21 and CP22 at the upper and lower sides of the second alignment line 220'B in the second row may be cut, respectively. Through the separation process of the first alignment line 210'B and the second alignment line 220'B in the first defective pixel PX22, as shown in the first and second repair areas RA1 and RA2 of FIGS. 13 and 14, the first alignment line 210'B_1 and the second alignment line 220'B in the first defective pixel PX22 may be separated from alignment lines of other pixels PX12 and PX32 located in the same column.

Further, in the second defective pixel PX23, the narrow portions CP31 and CP32 respectively at the upper and lower sides of the second alignment line 220'C in the third row may be cut, the portions CP41 and CP42 respectively at the upper and lower sides of the third alignment line 230'C in the third row may be cut, and the repair connection portion 250C connected to the repair line 240C in the third row may be cut. Through the separation process of the second alignment line 220'C and the third alignment line 230'C, which are in the first defective pixel PX22, and the repair connection portion 250C, as shown in the third to fifth repair areas RA3, RA4, and RA5 of FIGS. 13 and 14, the second alignment line 220'C_1 and the third alignment line 230'C_1 in the second defective pixel PX23 may be separated from alignment lines of other pixels PX13 and PX23 located in the same column, and the third alignment line 230'C_1 may be separated from the repair line 240C located in the same column.

Figure 15:
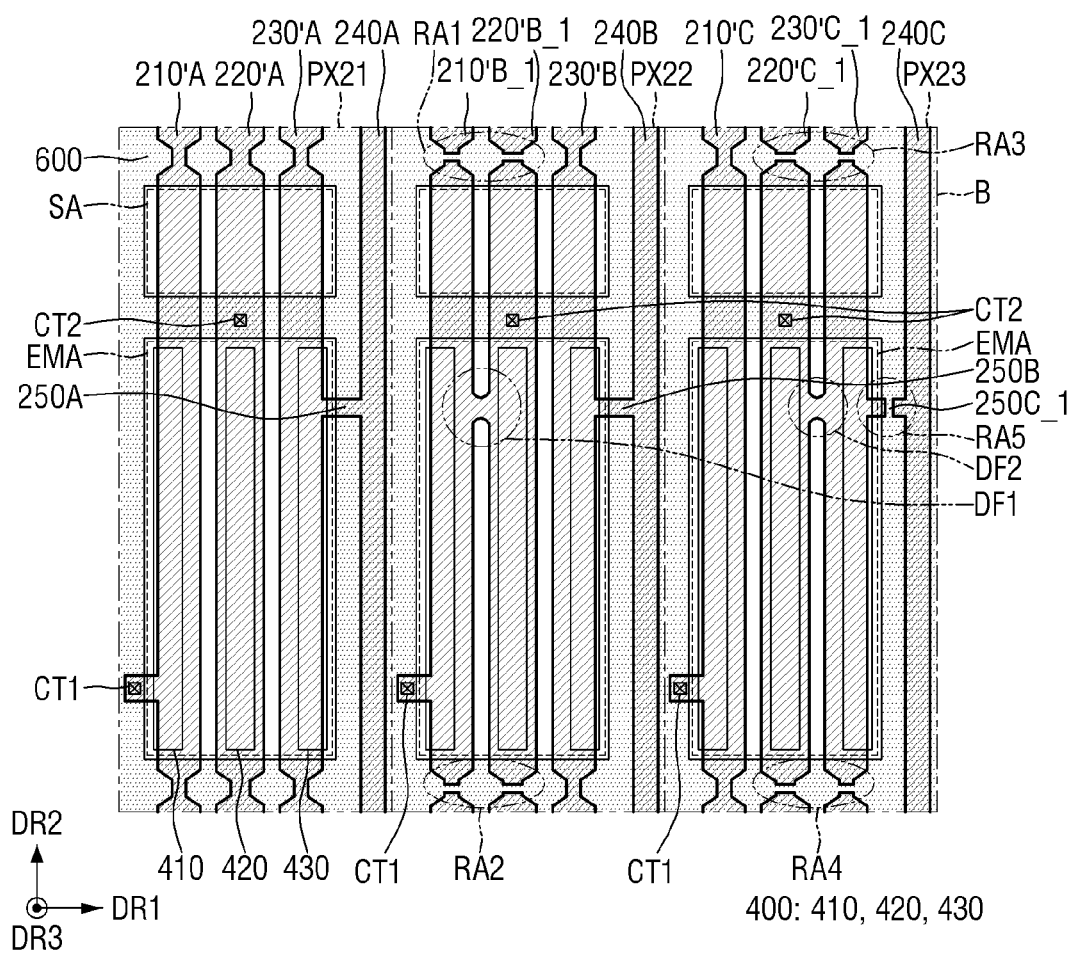

Subsequently, as shown in FIG. 15, a first bank 600 is formed on the first to third alignment lines 210', 220', and 230'.

For example, the first bank 600 may be formed to partition the sub-area SA and the light emission area EMA. As described above, the first bank 600 may be located to cover the repair line 240. As the first bank 600 is located to cover the repair line 240, it is possible to prevent the plurality of light emitting elements ED from being located between the third alignment line 230' and the repair line 240. For example, even when the same first alignment signal as the first alignment line 210' and the third alignment line 230' is applied to the repair line 240, the ink in which the light emitting elements ED are dispersed is sprayed onto the light emission area EMA, so that the light emitting elements ED may be aligned between the first alignment line 210' and the second alignment line 220' and between the second alignment line 220' and the third alignment line 230'.

Subsequently, the ink in which the plurality of light emitting elements ED are dispersed is sprayed onto the light emission area EMA partitioned by the first bank 600, and an alignment signal is applied to align the plurality of light emitting elements ED.

Figure 16:
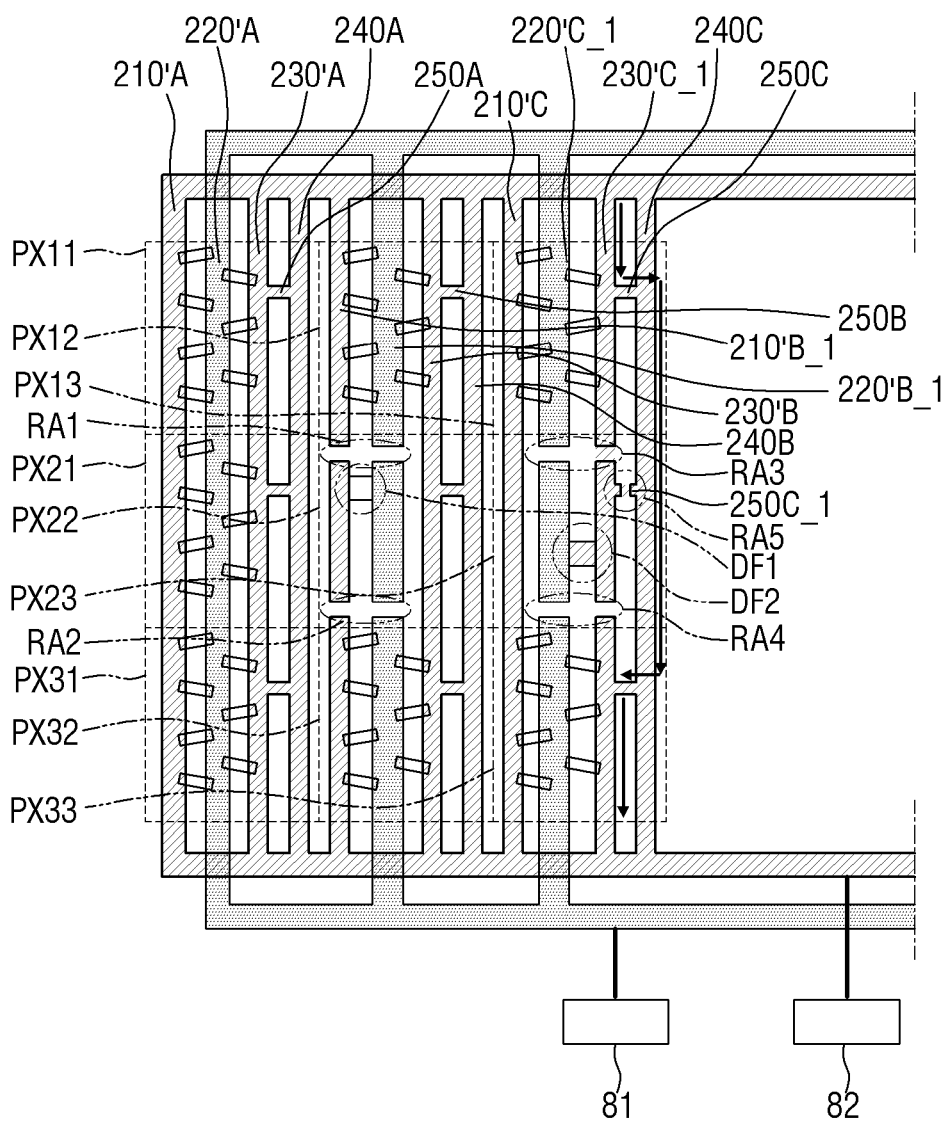
Figure 17:
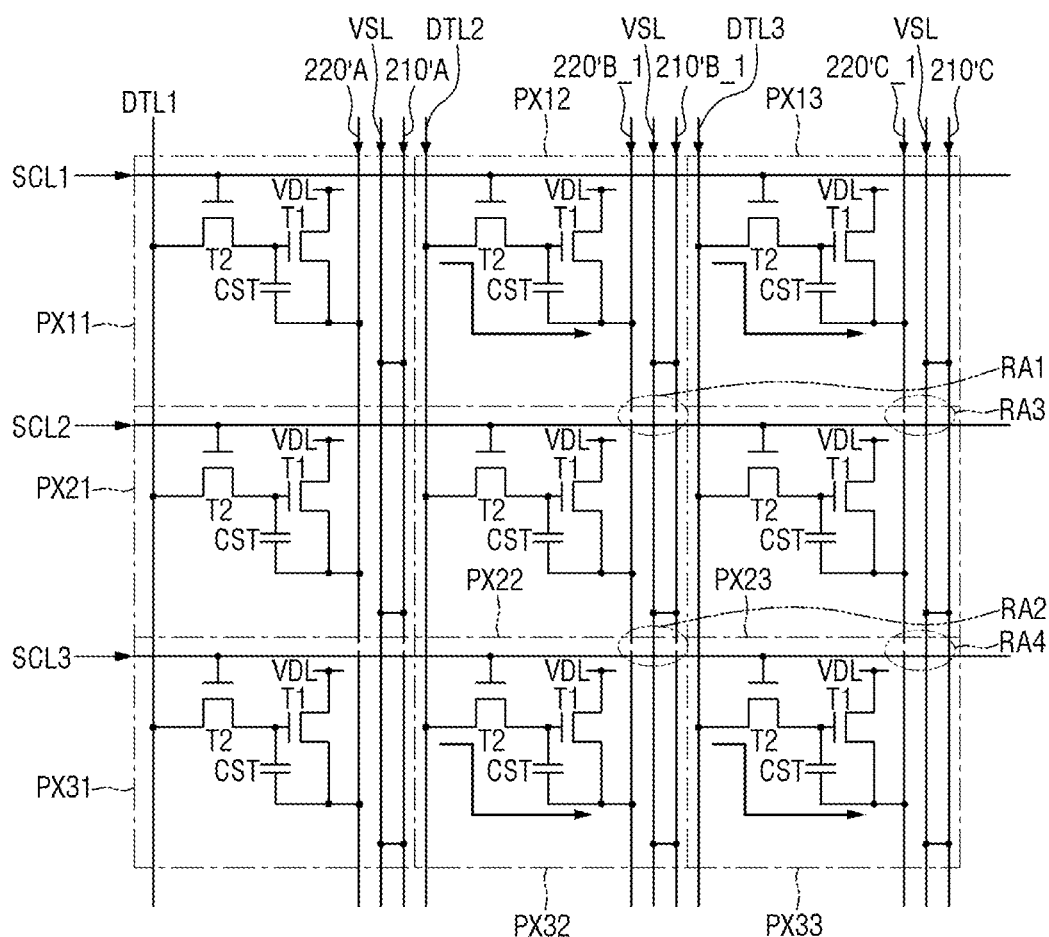
Figure 18:
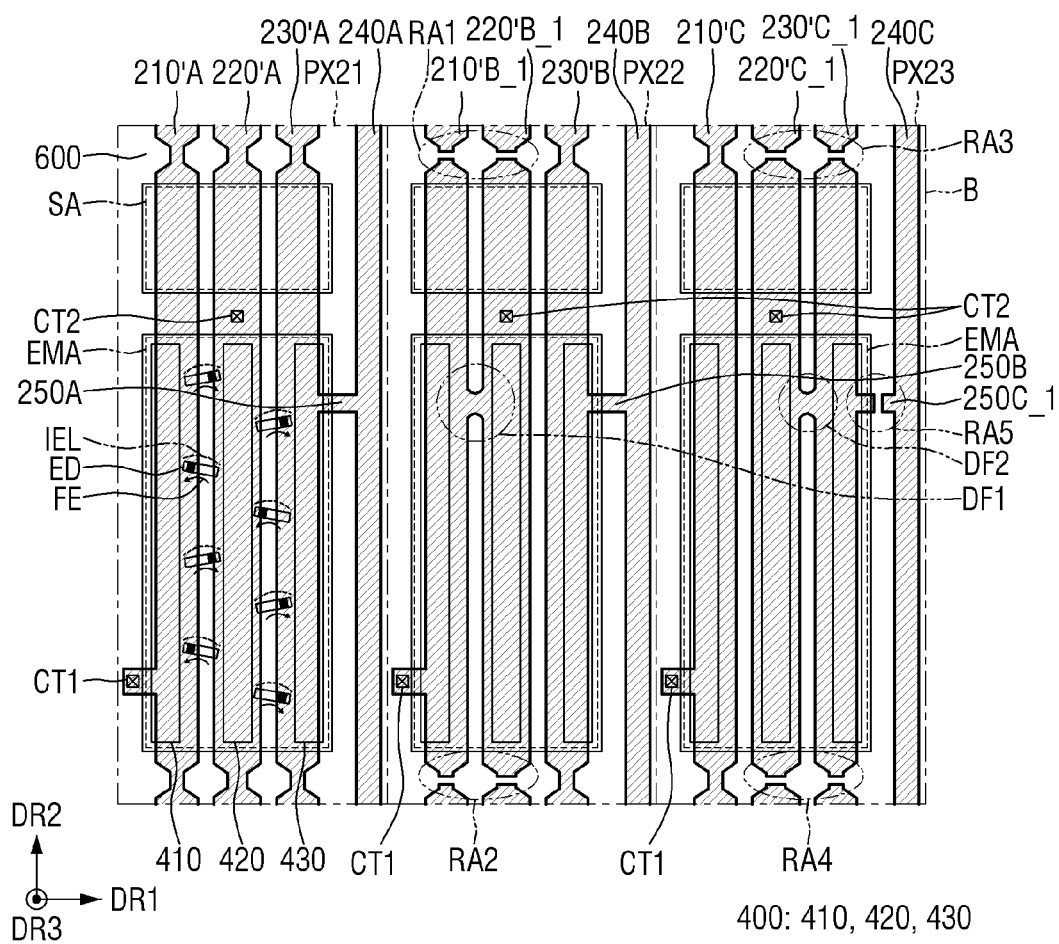

Referring to FIGS. 16 to 18, a first alignment signal is applied to the first alignment line 210', the third alignment line 230', and the repair line 240 using the first alignment pad 82, and a second alignment signal is applied to the second alignment line 220' using the second alignment pad 81, so that an electric field IEL may be formed between the first alignment line 210' and the second alignment line 220' and between the third alignment line 230' and the second alignment line 220'. Dielectrophoretic force FE is applied to the plurality of light emitting elements ED by the electric field IEL, so that both ends thereof may be aligned such that respective ones of the light emitting elements ED may be placed between the first alignment line 210' and the second alignment line 220', and between the third alignment line 230' and the second alignment line 220'.

For example, in the pixels PX11, PX21, and PX31 in the first column where no defects have occurred in the first to third alignment lines 210'A, 220'A, and 230'A, the first alignment signal may be applied to the first alignment line 210'A in the first column and the third alignment line 230'A in the first column using the first alignment pad 82. Further, in the pixels PX11, PX21, and PX31, the second alignment signal may be applied to the second alignment line 220'A in the first column using the second alignment pad 81. In the plurality of pixels PX11, PX21, and PX31 arranged in the first column, an electric field IEL may be formed between the second alignment line 220'A of the first column and the third alignment line 230'A of the first column, and between the first alignment line 210'A of the first column and the second alignment line 220'A of the first column. The light emitting elements ED dispersed into the plurality of pixels PX11, PX21, and PX31 arranged in the first column receives dielectrophoretic force FE by the electric field IEL, so that, as shown in FIGS. 19 and 20, both ends thereof may be aligned to be placed between the first alignment line 210A' in the first column and the second alignment line 220A' in the first column, and between the third alignment line 230A' in the first column and the second alignment line 220A' in the first column, respectively.

In the case of the pixels PX12, PX22, and PX32 of the second column in which a defect has occurred in the first and second alignment lines 210'B_1 and 220'B_1, but no defect has occurred in the third alignment line 230'13, the first and second alignment lines 210'B_1 and 220'B_1 are separated from the first defective pixel PX22, so that the first and second alignment lines 210'B_1 and 220'B_1 in the second column may be disconnected from each other along the same column, and the third alignment lines 230'B in the second column may be connected to each other along the same column. Accordingly, when applying the first alignment signal to the third alignment line 230'B using the first alignment pad 82, the first alignment signal may be applied to the third alignment line 230'B of the plurality of pixels PX12, PX22, and PX32 arranged in the second column. However, as the first and second alignment lines 210'B_1 and 220'B_1 are separated from the plurality of pixels arranged in the same column, the alignment signals using the first and second alignment pads 82 and 81 may not be transmitted.

Meanwhile, referring to FIGS. 17 and 18, the first alignment line 210'B_1 in the second column may be connected to the second voltage line VSL through the first electrode contact hole CT1 of each pixel PX. Accordingly, the first alignment signal may be transmitted to the first alignment line 210'B_1 in the second column by applying the first alignment signal to the second voltage line VSL.

Further, the second alignment line 220'B_1 in the second column may be connected to the first conductive pattern CDP through the second electrode contact hole CT2 of each pixel PX. The second alignment signal may be transmitted to the second alignment line 220'B_1 in the second column by driving the data line DTL2 in the second column and the scan lines SCL1, SCL2, and SCL3 in the first to third rows to apply the second alignment signal to the first conductive pattern CDP.

That is, even though the first alignment line 210'B_1 and the second alignment line 220'B_1 of the plurality of pixels PX12, PX22, and PX32 arranged in the second column are separated in the same column, an alignment signal may be applied to the first alignment line 210'B_1 and the second alignment line 220'B_1 by driving the underlying circuit element layer CCL.

In the plurality of pixels PX12, PX22, and PX32 in the second column, a first alignment signal may be applied to the first alignment line 210'B_1 in the second column using the second voltage line VLS, a second alignment signal may be applied to the second alignment line 220'B_1 through the first conductive pattern CDP by driving the data line DTL2 in the second column and the scan lines SCL1, SCL2, and SCL3 in the first to third rows, and a first alignment signal may be applied to the third alignment line 230'B in the second column using the first alignment pad 82. Accordingly, in the plurality of pixels PX12 and PX31 excluding the defective pixels PX22 arranged in the second column, an electric field IEL may be formed between the second alignment line 220'B_1 in the second column and the third alignment line 230'B in the second column, and between the first alignment line 210'B_1 in the second column and the second alignment line 220'B_1 in the second column. The light emitting elements ED dispersed into the plurality of pixels PX12 and PX32 arranged in the second column receives dielectrophoretic force FE by the electric field IEL, so that, as shown in FIGS. 19 and 20, both ends thereof may be aligned to be placed between the first alignment line 210'B_1 in the second column and the second alignment line 220'B_1 in the second column, and between the third alignment line 230'B in the second column and the second alignment line 220'B_1 in the first column, respectively.

In the case of the pixels PX13, PX23, and PX33 of the third column in which a defect has occurred in the second and third alignment lines 220'C_1 and 230'C_1 and no defect has occurred in the first alignment line 210'C, the second and third alignment lines 220'C_1 and 230'C_1 and the repair connection portion 250C_1 are separated from the second defective pixel PX23, so that the second and third alignment lines 220'C_1 and 230'C_1 in the third column may not be connected to each other along the same column, and the third alignment lines 220'C_1 in the third column may be connected to each other along the same column.

Accordingly, when the first alignment signal is applied to the first alignment line 210'C using the first alignment pad 82, the first alignment signal may be applied to the first alignment line 210'C of the plurality of pixels PX13, PX23, and PX33 arranged in the third column. However, as the second and third alignment lines 220'C_1 and 230'C_1 are separated from the plurality of pixels arranged in the same column, the alignment signals using the first and second alignment pads 82 and 81 may not be transmitted.

Meanwhile, referring to FIGS. 16 to 18, the second alignment line 220'C_1 in the third column may be connected to the first conductive pattern CDP through the second electrode contact hole CT2 of each pixel PX. Accordingly, the second alignment signal may be transmitted to the second alignment line 220'C_1 in the third column by driving the data line DTL3 in the third column and the scan lines SCL1, SCL2, and SCL3 in the first to third rows to apply the second alignment signal to the first conductive pattern CDP.

As described above, the third alignment line 230'C_1 in the third column may not be connected to the underlying circuit element layer CCL. Meanwhile, although the third alignment line 230'C_1 in the third column is not connected to the underlying circuit element layer CCL, the normal pixels PX13 and PX33 in the third column may be connected to the repair line 240C in the third column through the repair connection portion 250C. Accordingly, in the third alignment line 230'C_1 located in the normal pixels PX13 and PX33 in the third column, when the first alignment signal is applied to the repair line 240C using the first alignment pad 82, the first alignment signal may be transmitted to the third alignment line 230'C_1 through the repair connection portion 250C and the repair line 240C.

For example, when the first alignment signal is applied to the repair line 240C, in the normal pixels PX13 and PX33 in the third column, the third alignment line 230'C_1 and the repair line 240C may be connected through the repair connection portion 250C, and in the second defective pixel PX23, the repair connection portion 250C_1 is disconnected, and thus the third alignment line 230'C_1 and the repair line 240C may be separated. Accordingly, the first alignment signal may be transmitted to the repair line 240C through the third alignment line 230'C_1 and repair connection portion 250C of the pixel PX13 of 1×3, and may be transmitted to the third alignment line 230'C_1 through the repair connection portion 250C of the pixel PX33 of 3×3.

That is, although the second alignment line 220'C_1 and third alignment line 230'C_1 of the plurality of pixels PX12, PX22, and PX32 arranged in the third column are separated in the same column, the second alignment line 220'C_1 may apply an alignment signal by driving the underlying circuit element layer CCL, and the third alignment line 230'C_1 may apply an alignment signal through the repair line 240C and the repair connection portion 250C.

In the pixels PX13, PX23, and PX33 in the third column, a first alignment signal may be applied to the first alignment line 210'C_1 in the third column using the first alignment pad 82, a second alignment signal may be applied to the second alignment line 220'C_1 through the first conductive pattern CDP by driving the data line DTL3 in the third column and the scan lines SCL1, SCL2, and SCL3 in the first to third rows, and a first alignment signal may be applied to the third alignment line 230'C in the third column through the repair line 240C and repair connection portion 250C using the first alignment pad 82.

Accordingly, in the plurality of pixels PX13 and PX33 excluding the defective pixels PX23 located in the third column, an electric field IEL may be formed between the first alignment line 210'C in the third column and the second alignment line 220'C in the second column, and between the third alignment line 230'C it the third column and the second alignment line 220'C_1 in the third column. The light emitting elements ED dispersed into the plurality of pixels PX13 and PX33 arranged in the third column receives dielectrophoretic force FE by the electric field IEL, so that, as shown in FIGS. 19 and 20, both ends of respective ones thereof may be aligned to be placed between the first alignment line 210'C in the third column and the second alignment line 220'C_1 in the third column, and between the third alignment line 230'C_1 in the third column and the second alignment line 220'C_1 in the third column, respectively.

Subsequently, as shown in FIG. 21, the first to third alignment lines 210', 220', and 230' may be separated from the separator ROP of the sub-area SA to form the first to third electrodes 210, 220, and 230.

Because the planar structures of first to third electrodes 210A, 220A and 230A, repair line 240A, and repair connection portion 250A included in the normal pixel PX21 may be the same as those of FIGS. 4 and 5, a detailed description thereof will be omitted.

The first and second narrow portions of the first electrode 210B1 and the second electrode 220B_1 included in the first defective pixel PX22 may be disconnected and separated. The planar structures of the repair line 240B and repair connection portion 250B included in the first defective pixel PX22 may be the same as the planar structures of the repair line 240 and repair connection portion 250 of FIGS. 4 and 5.

The first and second narrow portions of the second electrode 220C_1 and third electrode 230C_1 included in the second defective pixel PX23, and the repair connection portion 250C_1, may be disconnected and separated. The planar structure of the first electrode 210C included in the second defective pixel PX23 may be the same as the planar structure of the first electrode 210 of FIGS. 4 and 5.

Figure 22:
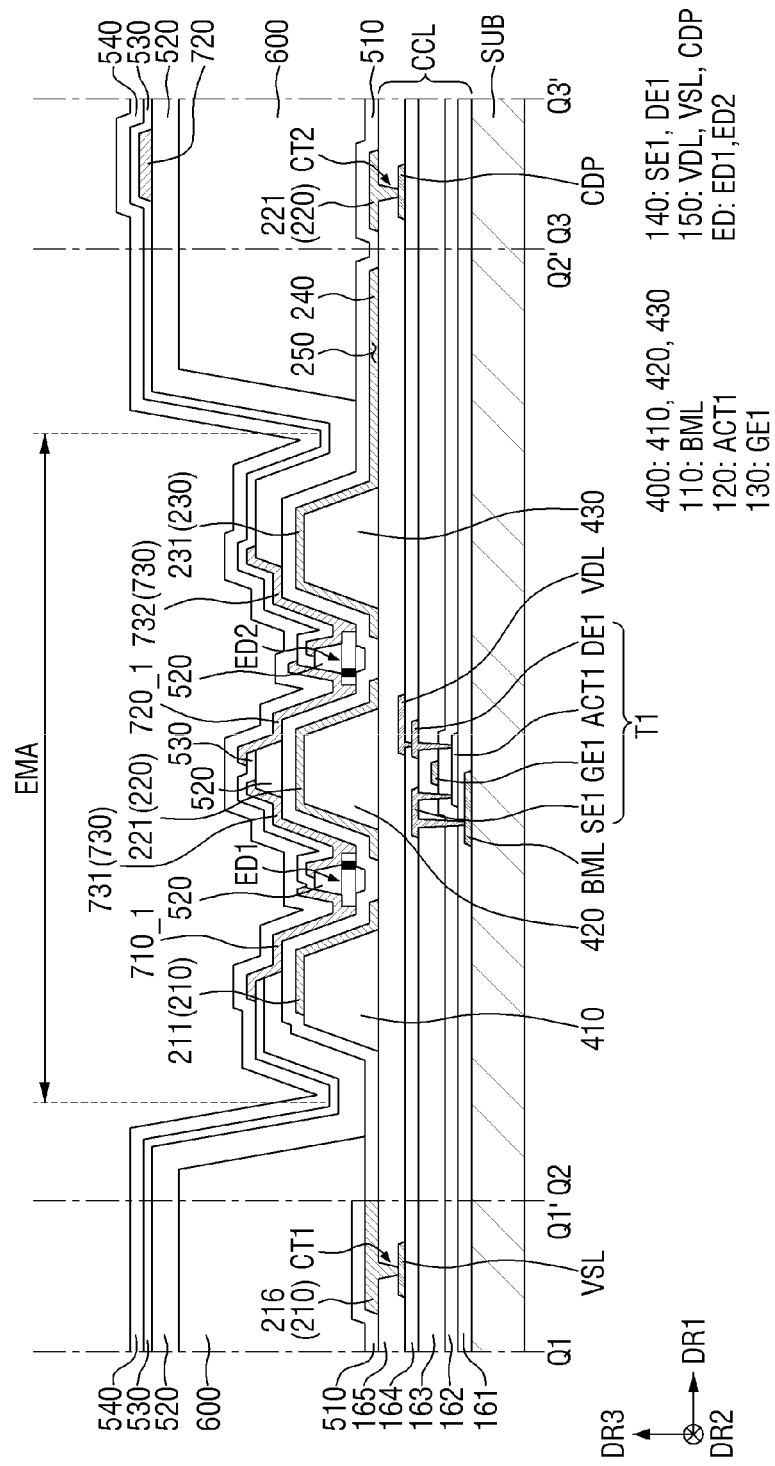
FIG. 22 is a cross-sectional view illustrating another example of a light emission area of a display device according to some embodiments.

FIG. 22 is a cross-sectional view illustrating another example of a light emission area of a display device according to some embodiments.

Referring to FIG. 22, the display device according to some embodiments may further include a fourth insulating layer 530. The fourth insulating layer 530 may be located on the third contact electrode 730 and the second insulating layer 520, and the first contact electrode 710 and the second contact electrode 720 may be located on the fourth insulating layer 530. The fourth insulating layer 530 may insulate the first contact electrode 710, the second contact electrode 720, and the third contact electrode 730 from each other such that they do not directly contact each other.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims, with functional equivalents thereof to be included therein.

What is claimed is:

1. A display device, comprising
   a substrate;
   a first electrode, a second electrode, and a third electrode spaced apart from each other in a first direction on the substrate;
   a repair line spaced apart from the first to third electrodes in the first direction on the substrate;
   a repair connection portion connecting the third electrode and the repair line; and
   light emitting elements, some of the light emitting elements being electrically connected to the first electrode and to the second electrode, and others of the light emitting elements being electrically connected to the second electrode and to the third electrode.

2. The display device of claim 1, further comprising a circuit element layer on the substrate, and comprising a first voltage line for applying a first power voltage and a transistor,
   wherein the first to third electrodes are located on the circuit element layer.

3. The display device of claim 2, wherein the first electrode is connected to the first voltage line, and the second electrode is connected to the transistor.

4. The display device of claim 3, wherein the third electrode is insulated from the circuit element layer.

5. The display device of claim 2, wherein the circuit element layer further comprises a via layer on the first voltage line and the transistor, and
   wherein the first electrode is connected to the first voltage line through a first electrode contact hole penetrating the via layer.

6. The display device of claim 5, wherein the second electrode is connected to the transistor through a second electrode contact hole penetrating the via layer.

7. The display device of claim 1, wherein the substrate comprises a light emission area, and a sub-area spaced apart from the light emission area in a second direction crossing the first direction, and wherein the first to third electrodes and the repair line extend in the second direction.

8. The display device of claim 7, wherein the first to third electrodes are located across the light emission area and the sub-area.

9. The display device of claim 8, wherein the first to third electrodes terminate in the sub-area.

10. The display device of claim 7, further comprising a first bank surrounding the light emission area and the sub-area.

11. The display device of claim 10, wherein the first bank exposes at least parts of the first to third electrodes and completely covers the repair line from above.

12. The display device of claim 1, further comprising:
a first insulating layer on the first to third electrodes, and defining a first opening exposing a part of an upper surface of the first electrode, and a second opening exposing a part of an upper surface of the second electrode.

13. The display device of claim 12, further comprising a contact electrode on the first insulating layer, and comprising a first contact electrode contacting the first electrode through the first opening, and a second contact electrode contacting the second electrode through the second opening.

14. The display device of claim 13, wherein the first insulating layer covers the third electrode.

15. A display device, comprising
a substrate;
a first electrode, a second electrode, and third electrode spaced apart from each other in a first direction on the substrate;
a repair line spaced apart from the first to third electrodes in the first direction on the substrate;
a repair connection portion connecting the third electrode and the repair line; and
light emitting elements between the first to third electrodes, and comprising a first light emitting element having ends respectively located on the first electrode and the second electrode, and a second light emitting element having ends respectively located on the second electrode and the third electrode.

16. The display device of claim 15, wherein the light emitting elements are not between the third electrode and the repair line.

17. A display device, comprising
a substrate; and
pixels on the substrate, each comprising:
a first electrode, a second electrode, and third electrode spaced apart from each other in a first direction on the substrate;
a repair line spaced apart from the first to third electrodes in the first direction on the substrate;
a repair connection portion between the third electrode and the repair line; and
light emitting elements between the first to third electrodes,
wherein the repair connection portion of a first pixel of the pixels connects the repair line of the first pixel and the third electrode of the first pixel, and
wherein the repair connection portion of a second pixel of the pixels is cut between the repair line of the second pixel and the third electrode of the second pixel.

18. The display device of claim 17, further comprising a circuit element layer on the substrate, and comprising a first voltage line for applying a first power voltage and a transistor, and
wherein the first to third electrodes are on the circuit element layer.

19. The display device of claim 18, wherein the first electrode is connected to the first voltage line, and
wherein the second electrode is connected to the transistor.

20. The display device of claim 19, wherein the third electrode is insulated from the circuit element layer.

* * * * *